(12) United States Patent
Takahashi

(10) Patent No.: US 6,621,557 B2
(45) Date of Patent: Sep. 16, 2003

(54) PROJECTION EXPOSURE APPARATUS AND EXPOSURE METHODS

(75) Inventor: Tetsuo Takahashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 80 days.

(21) Appl. No.: 09/756,717

(22) Filed: Jan. 10, 2001

(65) Prior Publication Data

US 2001/0038446 A1 Nov. 8, 2001

(30) Foreign Application Priority Data

Jan. 13, 2000 (JP) ..................................... P2000-004898
Aug. 1, 2000 (JP) ..................................... P2000-233474

(51) Int. Cl.⁷ ........................ G03B 27/54; G03B 27/42; G02B 17/00
(52) U.S. Cl. ........................... 355/67; 355/53; 359/364; 359/726
(58) Field of Search .......................... 355/30, 52, 53, 355/67; 353/52, 54, 55, 56, 57, 58, 59, 60, 61; 359/364, 512, 731, 732

(56) References Cited

U.S. PATENT DOCUMENTS

| 3,598,482 A | * | 8/1971 | Miller | 353/66 |
|---|---|---|---|---|
| 4,473,865 A | * | 9/1984 | Landa | 355/66 |
| 4,682,868 A | * | 7/1987 | Constantin et al. | 353/119 |
| 5,493,351 A | * | 2/1996 | Hamagishi et al. | 349/5 |
| 5,650,877 A | | 7/1997 | Phillips, Jr. et al. | |
| 5,717,518 A | | 2/1998 | Shafer et al. | |
| 5,876,105 A | * | 3/1999 | Rodriquez, Jr. | 353/119 |
| 5,953,106 A | | 9/1999 | Unno et al. | |
| 6,104,472 A | | 8/2000 | Suzuki | |
| 6,157,498 A | * | 12/2000 | Takahashi | 355/53 |
| 6,204,913 B1 | * | 3/2001 | Miyawaki et al. | 355/67 |

FOREIGN PATENT DOCUMENTS

| JP | 5-144701 | 6/1993 |
|---|---|---|
| JP | 9-213611 | 8/1997 |
| JP | 10-242048 | 9/1998 |
| JP | 11-287936 | 10/1999 |

\* cited by examiner

Primary Examiner—Alan A. Matthews

(57) ABSTRACT

Light from a pattern of a mask 3 travels through a first imaging optical system K1 to form a primary image I of the mask pattern. Light from the primary image I travels through a center aperture of a main mirror M1 and a lens component L2 to be reflected by a sub-mirror M2, and the light reflected by the sub-mirror M2 travels through the lens component L2 to be reflected by the main mirror M1. The light reflected by the main mirror M1 travels through the lens component L2 and a center aperture of the sub-mirror M2 to form a secondary image of the mask pattern at a reduction ratio on a surface of wafer 9. On this occasion, since a reflective surface R2 of the sub-mirror M2 is backed with a heat-sink plate 81 having a larger heat conductivity than the lens component L2, heat generated at the reflective surface R2, which is a back reflective surface generating relatively large quantity of heat, becomes easier to escape to the heat-sink plate 81 rather than to the lens component L2, whereby it becomes feasible to implement imaging with high accuracy.

20 Claims, 13 Drawing Sheets

Fig.7
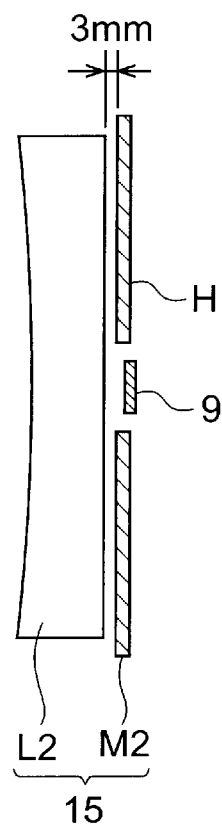
Fig.8
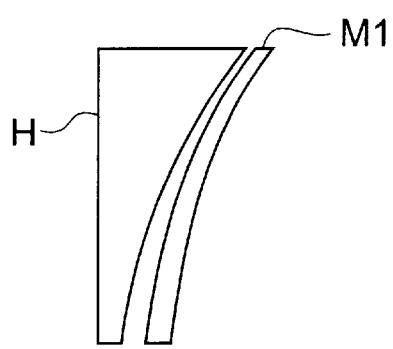
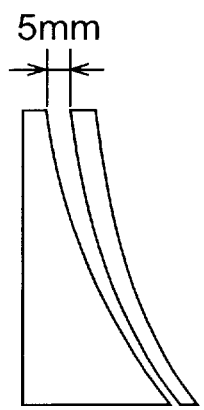

PROJECTION EXPOSURE APPARATUS AND EXPOSURE METHODS

BACKGROUND OF THE INVENTION

1. Field of the Invention

The present invention relates to projection exposure apparatus and exposure methods, for example, for fabricating semiconductor devices, liquid-crystal display devices, etc. by photolithography and, more particularly, to projection exposure apparatus provided with a projection optical system comprised of catadioptric optics or catoptric optics, and exposure methods using such apparatus.

2. Related Background Art

In the photography step for fabrication of the semiconductor devices and other devices, the projection exposure systems are used for printing a pattern image of a photomask or a reticle (which will be referred to hereinafter together as "reticle") through a projection optical system on a wafer (or a glass plate or the like) coated with a photoresist or the like.

The resolving power required of the projection optical system used in such projection exposure systems has been becoming higher and higher with increase in integration of the semiconductor devices and other devices. For meeting this demand, there arise the needs for decrease in the wavelength of illumination light and for increase in the numerical aperture (N.A.) of the projection optical system.

However, the decrease in the wavelength of illumination light leads to limitation of kinds of glass materials applicable to practical use because of absorption of light. The glass materials practically applicable at present in the wavelength range of not more than 300 nm are only synthetic silica and fluorite, and for this reason, there are desires for use of catoptric optics in order to effect correction for chromatic aberration. Specifically, practical use has considerably been developed using dioptric optics with the KrF laser of 248 nm, but it is very difficult to realize practical use using dioptric optics in the wavelength range of not more than 200 nm. Therefore, expectations are rising for the catadioptric optics. Particularly, it is known that fluorite has sufficient transmittance even at 100 nm, and since it can be used as a refracting member above this range, the catadioptric optics can be constructed in the range of wavelengths 100 to 300 nm.

Several types of the catadioptric optics have been proposed heretofore. Among them, an optical system of a type wherein the central part of N.A. is shielded (which will be referred to hereinafter as a center shield type) is a promising type, because all optical elements can be assembled on the basis of one optical axis without inclusion of a path deflecting member by use of two or more reflective surfaces and because it has a merit of capability of imaging an object on the optical axis on the image plane and thus correcting for aberration in a wide exposure field by a small number of optical elements. Prior arts of this type include those disclosed, for example, in U.S. Pat. No. 5,717,518, No. 5,650,877, and so on.

In general, the illumination light radiates to the projection optical system during exposure in the projection exposure apparatus, so as to bring about absorption of the illumination light (or exposure light), and the optical members undergo, for example, asymmetric deformation, internal temperature distribution, etc., thus causing variation in aberration (see Japanese Patent Application Laid-Open No. H09-213611).

SUMMARY OF THE INVENTION

This aberration variation is considered to be not only due to absorption inside the glass materials of the projection optical system, but also due to absorption in thin films or the like on surfaces. Particularly, in the catadioptric optics, absorption at the reflective surfaces is considered to be especially larger than that inside the glass materials and in the surface thin films, and the aberration variation due to absorption can be more problematic than in the case of the dioptric optics.

An effective means for the projection optical systems in the extreme ultraviolet region is use of a back reflector that causes reflection on a back surface of a refracting member, for example, as described in aforementioned U.S. Pat. No. 5,717,518. In this case, materials used need to be glass materials capable of transmitting light in this wavelength range, e.g., silica, fluorite, $BaF_2$, and $LiF_2$. Since these glass materials have large dN/dT and expansion coefficients, if a refracting member has a reflective surface, as described above, relatively large quantity of heat generated at the reflective surface will propagate into the refractive member to produce a relatively large temperature distribution inside glass. It is thus considered that there are some measures necessary for suppressing the aberration variation. Under such circumstances that development of thin films is presently under way, particularly, for the exposure light of not more than 200 nm and in conjunction with the fact that the performance expected for the projection optical system itself is also of very high precision in this wavelength range, the aberration variation due to irradiation of the optical members including the reflective surfaces is a significant problem.

Further, in the case of the projection optical system in above-noted U.S. Pat. No. 5,717,518, the beams are considerably concentrated in the finally focused part near the reduced image plane, i.e., in the last optical path in the refracting and reflecting member. Such beams can pose a significant problem, because they produce a heterogeneous large temperature distribution in the optical member.

Even reflecting members sometimes need to be made of a substance with a large expansion coefficient, such as $CaF_2$ or BSC7, because of compatibility with a reflective coat. In such cases a problem will be posed by aberration caused by thermal expansion because of much greater absorptances than those of refracting members.

For avoiding this, it is conceivable to space this refracting and reflecting member apart from the image plane. However, taking it into consideration that the center shield part needs to be designed as small as possible, to space the refracting and reflecting member apart from the image plane will raise considerable difficulties in design. As countermeasures against the aberration due to such heterogeneous temperature distribution, for example, Japanese Patent Application Laid-Open No. H10-242048 notes that rotationally asymmetric aberration variation occurs during execution of scanning exposure or the like and proposes a method and the like for preliminarily fabricating optical means comprising aspherical surfaces in accordance with the aberration variation and moving it as occasion arises. For carrying out this method, however, it is necessary to make the rotationally asymmetric aspherical surfaces according to the aberration variation and to prepare a fabrication system dedicated therefor. In addition, a decentering adjusting mechanism with considerably high accuracy also needs to be incorporated in order to properly decenter the aspherical surfaces during irradiation, which makes the fabrication of the projection optical system difficult.

The aberration variation also occurs with change in the temperature of the entire projection optical system.

However, as to the aberration due to deformation of the reflector among such aberration variation, since change of beams due to reflection is approximately four times greater than that due to refraction, influence of temperature change tends to raise a problem in the above-described catadioptric optics. For that reason, it can be said that it is desirable to design the optics, preliminarily taking the deformation of the reflector into consideration.

An example of the countermeasures in this case is the one disclosed in Japanese Patent Application Laid-Open No. H05-144701. This invention is to determine thermal shape changes of some lenses forming the projection optical system and implement optical adjustment with adjusting means, based thereon. It, however, seems considerably difficult in practice to measure the shape changes of the lenses during the exposure operation without negatively affecting the exposure.

In view of the above problems, an object of the present invention is to provide projection exposure apparatus and exposure methods that can readily reduce the aberration variation caused by the temperature change due to the irradiation of the catadioptric optics and other optics with the exposure light.

In order to accomplish the above object, a first projection exposure apparatus of the present invention is a projection exposure apparatus comprising a catadioptric system for focusing an image of a first surface on a second surface, wherein the catadioptric system comprises a member having a reflective surface, said apparatus comprising a heat-transfer member which contains a material with a larger heat conductivity than that of the member having the reflective surface and which is disposed in contact with the member having the reflective surface.

In this case, since the heat-transfer member containing the material with the larger heat conductivity than that of said member having the reflective surface is disposed in contact with said member having the reflective surface, the heat generated at the reflective surface with incidence of the exposure light can be readily radiated to the outside of said member having the reflective surface. Therefore, the heat can be prevented from accumulating inside said member having the reflective surface, and thus it becomes feasible to implement highly accurate exposure with less aberration variation.

In the first projection exposure apparatus of the present invention, it is preferable that said member having the reflective surface comprise an optical member transmitting light and a reflecting plate having said reflective surface, that a surface of said reflecting plate on the side where said reflective surface is formed, have an effective reflection area and be in contact with said optical member, and that said heat-transfer member be in contact with a back face of a region of said reflecting plate in which said effective reflection area exists.

The heat tends to accumulate most in the vicinity of the effective reflection area that actually reflects the light in the reflective surface. When the heat-transfer member is in contact with the back face of the region of the reflecting plate where the effective reflection area exists, as in the present invention, the heat can be radiated from the high-temperature region of the member having the reflective surface to the outside. This permits highly accurate exposure with far less aberration variation.

In order to keep the mentioned optical member from a mechanical load such as pressure occurring in the structure of direct contact of the heat-transfer member with a reflecting optical member having a reflective surface or with a refracting optical member having a reflective surface, it can also be contemplated that the projection exposure apparatus comprises a heat-transfer member with a large heat conductivity placed at a position on the opposite side to a direction of reflection of light on the reflective surface of the optical member and with a predetermined space from the optical member and at least a part of the space between the optical member and the heat-transfer member is filled with a predetermined gas.

In this case, since the space between the optical member and the heat-transfer member is considerably small with the gas in between, the heat at the reflective surface can be radiated to the heat-transfer member with little thermal resistance of the gas. Therefore, it becomes feasible to prevent accumulation of heat inside the optical member and implement highly accurate exposure with less aberration variation. It is also preferable to set the space between the optical member and the heat-transfer member to not more than 30 mm. The reason is that if the space is over 30 mm effective heat transfer to the heat-transfer member will become more difficult, because the heat is not transferred over the heat capacity of the gas.

A preferred form of the above apparatus further comprises forced cooling means connected to said heat-transfer member.

In this case, since said heat-transfer member can be cooled by the forced cooling means, the heat radiation effect is enhanced so as to more effectively prevent increase in the temperature of the member having said reflective surface.

In a preferred form of the above apparatus, said catadioptric system comprises a first reflective surface and a second reflective surface opposed to each other, as said reflective surface, said first reflective surface and second reflective surface have a first transparent portion and a second transparent portion, respectively, capable of transmitting at least part of light in the central part, and at least one of said first reflective surface and second reflective surface is included in said member having the reflective surface.

In this case, the exposure light emerging from the first surface travels through the second transparent portion onto the first reflective surface to be reflected thereby, thereafter is further reflected by the second reflective surface, and then is guided through the first transparent portion to the second surface. On this occasion, since at least one of the first reflective surface and second reflective surface is included in the member having said reflective surface, the heat-transfer member can quickly radiate the heat generated in either of the first reflective surface and the second reflective surface as a result of reflection on the back face by said member having the reflective surface, to the outside of said member having the reflective surface.

A second projection exposure apparatus of the present invention is a projection exposure apparatus comprising a catadioptric system for focusing an image of a first surface on a second surface, wherein said catadioptric system comprises a first reflective surface and a second reflective surface opposed to each other, and a refracting member placed between said first reflective surface and second reflective surface, and wherein at least one surface of said refracting member is provided either with no coat or with three or less coat layers.

In this case, in the refracting member placed between said first reflective surface and second reflective surface, the exposure light passes multiple times between the first reflective surface and the second reflective surface. On this occasion, since at least one surface of the refracting member placed between said first reflective surface and second reflective surface is provided either with no coat or with three or less coat layers, absorption at the transmissive surface of the refracting member can be controlled to the minimum. This makes it feasible to prevent accumulation of heat in the refracting member and to implement highly accurate exposure with less aberration variation.

In a preferred form of the above apparatus, at least one of said first reflective surface and second reflective surface has a positive power, said first reflective surface and second reflective surface have a first transparent portion and a second transparent portion, respectively, capable of transmitting at least part of light in the central part, and a shield plate for absorbing light entering said catadioptric system is disposed in a part of the space between said first transparent portion and second transparent portion.

In this case, the exposure light emerging from the first surface travels through the second transparent portion onto the first reflective surface to be reflected thereby, thereafter is further reflected by the second reflective surface, and then is guided through the first transparent portion to the second surface. On this occasion, since the shield plate for absorbing the light entering said catadioptric system is disposed in a part of the space between said first transparent portion and second transparent portion, it becomes feasible to suppress appearance of flare caused by reflected light on the transmissive surface of the refracting member placed between the first reflective surface and the second reflective surface, with effectively utilizing the exposure light.

A third projection exposure apparatus of the present invention is a projection exposure apparatus comprising a catadioptric system for focusing an image of a first surface on a second surface, wherein the catadioptric system comprises a first reflective surface and a second reflective surface, at least one of the first reflective surface and second reflective surface has a positive power, said first reflective surface and second reflective surface have a first transparent portion and a second transparent portion, respectively, capable of transmitting at least part of light in the central part, at least one of said first reflective surface and second reflective surface is formed in an end face of a transmissive member, and the following condition is met:

$$S2/\phi2^2 < 3S1/(\phi1^2 - \phi2^2) \tag{1}$$

where $\phi1$ is an effective diameter and S1 an absorptance on the occasion of incidence of light to the reflective surface formed in the end face of said transmissive member, and $\phi2$ an effective diameter and S2 an absorptance on the occasion of incidence of light to a transmissive surface kept in contact with the reflective surface formed in the end face of said transmissive member.

In this case, the exposure light emerging from the first surface travels through the second transparent portion onto the first reflective surface to be reflected thereby, thereafter is further reflected by the second reflective surface, and then is guided through the first transparent portion to the second surface. On this occasion, since above Condition (1) is met at the first reflective surface or at the second reflective surface, absorption of the exposure light, i.e., quantities of heat generated are balanced to some extent between the reflective surface and the transmissive surface. This can prevent the transmissive member from being locally heated to cause heterogeneous aberration variation, whereby it becomes feasible to implement highly accurate exposure.

A fourth projection exposure apparatus of the present invention is a projection exposure apparatus comprising a projection optical system for focusing an image of a first surface on a second surface, wherein said projection optical system comprises at least one reflector and an expansion coefficient $\beta$ of at least one of materials making said reflector satisfies the following condition:

$$\alpha/3 < \beta < 3\alpha, \alpha \neq \beta \tag{2}$$

where $\alpha$ is a coefficient of thermal expansion, $(dL/L)/dT$, of a barrel of said projection optical system.

In this case, since the expansion coefficient $\beta$ of at least one of the materials making the reflector satisfies above Condition (2), the expansion coefficients of the reflector and the barrel can be made approximately equal to each other. Namely, since the size of the barrel varies according to change in the focal length due to the heat generated in the reflector, variation can be suppressed in the focusing condition of the projection optical system and it thus becomes feasible to implement highly accurate exposure.

Exposure methods of the present invention are exposure methods using the above projection exposure apparatus according to either of the above aspects of the present invention, which comprise a step of generating illumination light, a step of placing a mask with a predetermined pattern formed therein, on the first surface and illuminating the mask with said illumination light, and a step of projecting an image of said predetermined pattern of said mask placed on said first surface, onto a photosensitive substrate placed on said second surface.

In this case, use of the projection exposure apparatus according to either of the aspects of the present invention permits prevention of the aberration variation of the projection optical system and the variation of the focus condition, whereby it becomes feasible to implement highly accurate exposure.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 7 is a diagram to show the projection optical system of the projection exposure apparatus according to the fifth embodiment.

FIG. 8 is a diagram to show the main part of the projection optical system of the projection exposure apparatus according to the sixth embodiment.

DESCRIPTION OF THE PREFERRED EMBODIMENTS

First Embodiment

Figure 1:
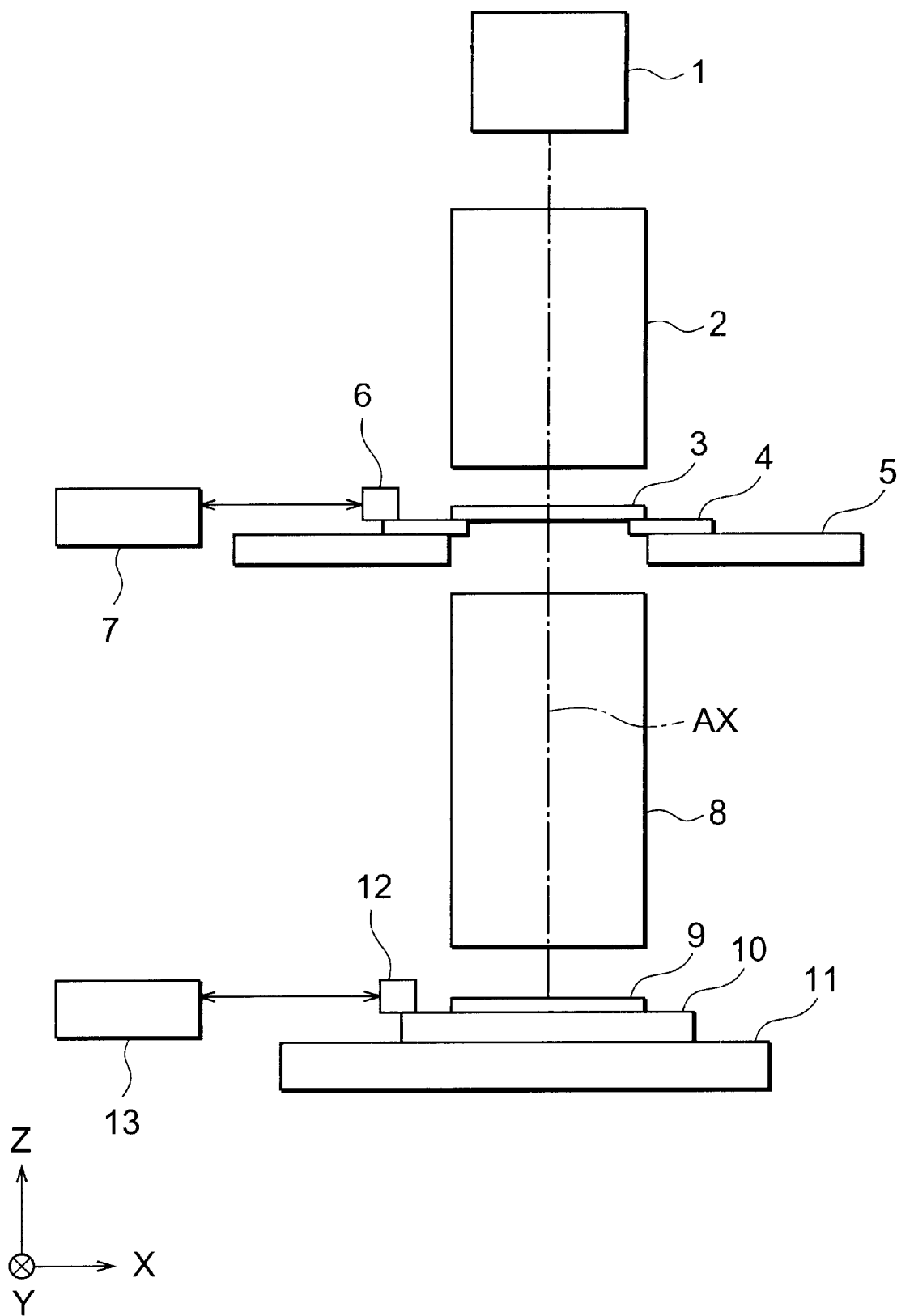
FIG. 1 is a diagram to schematically show the overall structure of the projection exposure apparatus according to the first embodiment of the present invention.

FIG. 1 schematically shows the overall structure of the projection exposure apparatus according to the first embodiment of the present invention. In FIG. 1, the Z-axis is set in parallel to the optical axis AX of the projection optical system 8 constituting the projection optics, the X-axis in parallel to the plane of FIG. 1 in the plane normal to the optical axis AX, and the Y-axis normal to the plane of the drawing.

The projection exposure apparatus illustrated is provided, for example, with an $F_2$ laser (the lasing center wavelength 157.6 nm) as a light source for supplying the illumination light in the ultraviolet region. The light emitted from the light source 1 uniformly illuminates a mask 3 with a predetermined pattern formed therein, through an illumination optical system 2.

A bending mirror or a plurality of bending mirrors for deflecting the optical path are placed in the optical path from the light source 1 to the illumination optical system 2 as occasion demands. If the light source 1 and the main body of the projection exposure apparatus are constructed as separate bodies, there are provided an automatic tracking unit for always directing the $F_2$ laser light from the light source 1 toward the main body of the projection exposure apparatus, a shaping optical system for shaping the beam cross-sectional shape of the $F_2$ laser light from the light source 1 into predetermined size and shape, and an optical system such as a light-quantity adjuster. The illumination optical system 2 has an optical integrator, for example, consisting of a fly's eye lens or an internal reflection type integrator for forming a surface illuminant of predetermined size and shape, a field stop for defining the size and shape of an illumination area on the mask 3, and an optical system such as a field-stop imaging optical system for projecting an image of the field stop onto the mask. Further, the optical path between the light source 1 and the illumination optical system 2 is hermetically enclosed in a casing (not illustrated) and the space from the light source 1 to the optical member closest to the mask in the illumination optical system 2 is replaced with an inert gas such as helium gas or nitrogen, which is a gas with a low absorptance for the exposure light.

The mask 3 is held in parallel to the XY plane on a mask stage 5 by a mask holder 4. The pattern to be transferred is formed in the mask 3 and the mask is illuminated in a pattern area of a rectangular shape (slit shape) having the longer side along the Y-direction and the shorter side along the X-direction out of the entire pattern area.

The mask stage 5 is arranged to be two-dimensionally movable along the mask surface (i.e., along the XY plane) by action of a driving system not illustrated, and is constructed in such structure that coordinates of the position thereof are measured by an interferometer 7 using a mask moving mirror 6 and the position of the mask stage is controlled based thereon.

The light from the pattern formed in the mask 3 is projected through the catadioptric projection optical system 8 to form a mask pattern image on a wafer 9 being a photosensitive substrate. The wafer 9 is held in parallel to the XY plane on a wafer stage 11 by a wafer holder 10. Then a pattern image is formed in an exposure area of a rectangular shape having the longer side along the Y-direction and the shorter side along the X-direction on the wafer 9, optically corresponding to the illumination area of the rectangular shape on the mask 3.

The wafer stage 11 is arranged to be two-dimensionally movable along the wafer surface (i.e., along the XY plane) by action of a driving system not illustrated and is constructed in such structure that coordinates of the position thereof are measured by an interferometer 13 using a wafer moving mirror 12 and the position thereof is controlled based thereon.

In the projection exposure apparatus illustrated, the projection optical system 8 is constructed so that the inside thereof is kept in an airtight state between the optical member proximate to the mask and the optical member proximate to the wafer out of those constituting the projection optical system 8, and the gas inside the projection optical system 8 is replaced with an inert gas such as helium gas or nitrogen.

Further, the mask 3, the mask stage 5, etc. are placed in the short optical path between the illumination optical system 2 and the projection optical system 8 and the inside of the casing (not illustrated) hermetically enclosing the mask 3, the mask stage 5, etc. is filled with the inert gas such as nitrogen or helium gas.

The wafer 9, the wafer stage 11, etc. are placed on the optical path immediately below the projection optical system 8, and the inside of the casing (not illustrated) hermetically enclosing the wafer 9, the wafer stage 11, etc. is filled with the inert gas such as nitrogen or helium gas.

As described above, an atmosphere little absorbing the exposure light is established throughout the entire optical path from the light source 1 to the wafer 9. The field area (illumination area) on the mask 3 and the projection area (exposure area) on the wafer 9, defined by the projection optical system 8, are both of the rectangular shape having the shorter side along the X-direction, as described above. Therefore, scanning exposure of the mask pattern is implemented in a region having the width equal to the longer side of the exposure area and the length according to a scanning length (moving distance) of the wafer 9 on the wafer 9, by moving (or scanning) the mask stage 5 and the wafer stage 11, in turn the mask 3 and wafer 9, in synchronism along the shorter-side direction of the rectangular exposure area and illumination area, i.e., along the X-direction while controlling the positions of the mask 3 and wafer 9 using the driving systems and interferometers (7, 13).

Figure 2:
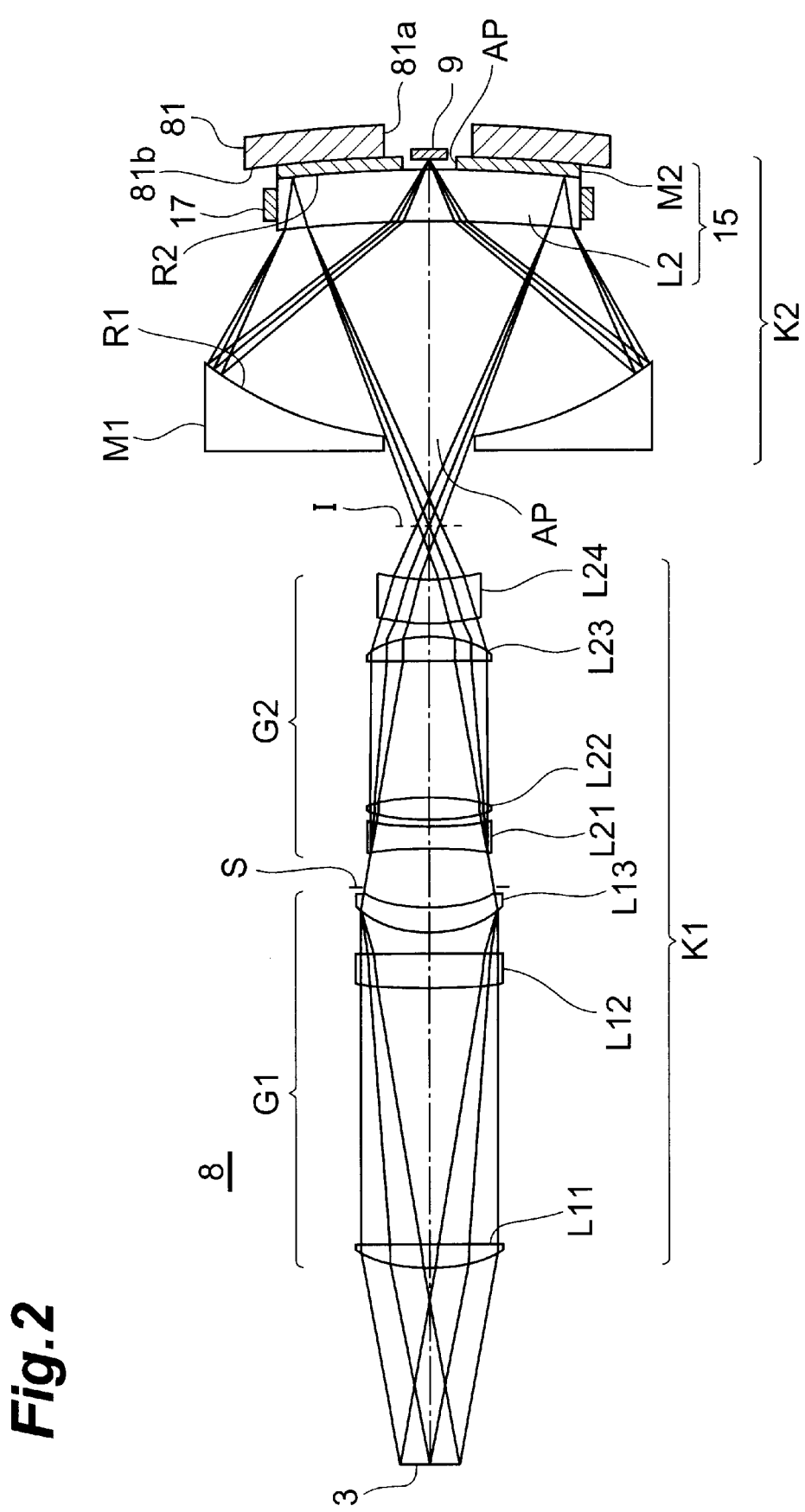
FIG. 2 shows the projection optical system of the projection exposure apparatus according to the first embodiment.

FIG. 2 is a diagram to illustrate the structure of the projection optical system 8 incorporated in the projection exposure apparatus of FIG. 1. This projection optical system 8 is comprised of a first imaging optical system K1 for forming a primary image (intermediate image) I of the pattern of the mask 3, a second imaging optical system K2 for forming a secondary image of the mask pattern at a demagnification ratio on the wafer 9 of the photosensitive substrate, based on the light from the primary image I, and a heat-sink plate 81 being a heat-transfer member for preventing increase in the temperature of a back reflector forming the second imaging optical system K2.

The first imaging optical system K1 is comprised of a first lens unit G1 having a positive refractive power, an aperture stop S, and a second lens unit G2 having a positive refractive power, which are arranged in the order named from the mask side.

Here the first lens unit G1 consists of a positive meniscus lens L11 with a convex surface of an aspherical shape facing to the mask side, a positive meniscus lens L12 with a convex surface of an aspherical shape facing to the mask side, and a positive meniscus lens L13 with a concave surface of an aspherical shape facing to the wafer side, which are arranged in the order stated from the mask side.

The second lens unit G2 consists of a biconcave lens L21 whose surface on the mask side is of an aspherical shape, a biconvex lens L22 whose surface on the mask side is of an aspherical shape, a positive meniscus lens L23 with a convex surface of an aspherical shape facing to the wafer side, and a positive meniscus lens L24 with a concave surface of an aspherical shape facing to the wafer side, which are arranged in the order stated from the mask side.

The second imaging optical system K2 is comprised of a main mirror M1 having a front reflective surface R1 with a concave surface facing to the wafer side and having an aperture AP of a transparent portion in the center, a lens component L2 of a refracting member, and a sub-mirror M2 with a reflective surface R2 disposed on a wafer-side lens surface of the lens component L2 and having an aperture AP of a transparent portion in the center, which are arranged in the order stated from the mask side. A back reflector 15 as the member having the reflective surface is comprised of the sub-mirror M2 as the reflecting plate and the lens component L2 as the optical member, and the lens component L2 composes a refracting part (refracting member) of the back reflector 15. The lens component L2 is held by a holder 17 of ring shape.

Here the lens component L2 forming the refracting part of the back reflector 15 is constructed in a negative meniscus lens shape with a concave surface of an aspherical shape facing to the mask side. The reflective surface R2 of the sub-mirror M2 is formed in the shape with the concave surface facing to the mask side. All the optical elements (G1, G2, M1, M2) constituting the projection optical system 8 are arranged along the single optical axis AX. The main mirror M1 is placed in the vicinity of the focusing position of the primary image I and the sub-mirror M2 in close vicinity of the wafer 9.

In the present embodiment, fluorite (crystal of $CaF_2$) is used for all the refracting optical members (lens components) forming the projection optical system 8. The back reflector 15 is constructed by laying an aluminum film on the back face of fluorite. The lasing center wavelength of the $F_2$ laser light being the exposure light is 157.6 nm.

The heat-sink plate 81 is a circular aluminum plate having an aperture 81a in the center and is attached so as to back the reflective surface R2. Namely, the heat-sink plate 81 supports the back reflector 15 from the bottom on the wafer 9 side in the barrel. On this occasion, since the support surface 81b of the heat-sink plate 81 and the reflective surface R2 have the same curvature, the aluminum film formed on the back face of the lens component L2 closely fits the support surface 81b.

In this structure, the heat generated inside the back reflector 15, particularly at the reflective surface R2, propagates through the aluminum film to the heat-sink plate 81, so as to readily prevent the temperature of only the back reflector 15 from becoming higher than that of the surroundings and prevent a temperature distribution from being formed inside the back reflector 15. Namely, it becomes feasible to prevent the aberration variation. It is noted that the aperture 81a is shaped so as not to block the aperture AP of the reflective surface R2.

An effective reflection area that actually reflects light, exists in the surface on the side where the reflective surface R2 of the sub-mirror M2 is formed. It is preferable to set the heat-sink plate 81 in contact with the back of the region where the effective reflection area of the sub-mirror M2 exists. The heat tends to accumulate most near the effective reflection area actually reflecting the light in the reflective surface R2 of the back reflector 15. However, the heat in the high-temperature region of the back reflector 15 can be radiated to the outside by setting the heat-sink plate 81 in contact with the back face of the region where the effective reflection area of the sub-mirror M2 exists, as described above. This makes it feasible to implement highly accurate exposure with far less aberration variation.

Now, the heat conductivity of the heat-sink plate 81 will be described. Since the lens component L2 forming the back reflector 15 is made of fluorite, the heat conductivity thereof is 10.3 $Wm^{-1}K^{-1}$. The heat conductivity of the aluminum heat-sink plate 81 is 236 $Wm^{-1}K^{-1}$. The absorption due to back reflection is approximately 10%, which is greater than the absorption due to transmission being about 1%, but the major part of the heat generated by back reflection of the lens component L2 is transferred to the heat-sink plate 81 to be radiated, because the heat conductivity of the heat-sink plate 81 is ten or more times greater than that of the lens component L2 as described above.

The material of the backing heat-sink plate 81 can be any material having a larger heat conductivity than the material of the lens component L2 (fluorite in this case), and most metals satisfy this condition.

Moreover, in order to prevent the heat generated at the reflective surface R1 from increasing the temperature in the main mirror M1 of the reflector forming the second imaging optical system K2, a heat-transfer member may also be attached to the surface on the mask 3 side so as to back the main mirror M1, in the same manner as the attachment of the heat-sink plate 81 to the back reflector 15.

As apparent from the above description, in the present embodiment the light from the pattern of the mask 3 travels through the first imaging optical system K1 to form the primary image (intermediate image) I of the mask pattern. The light from the primary image I travels through the center aperture AP of the main mirror M1 and the lens component L2 to be reflected by the sub-mirror M2 and the light reflected by the sub-mirror M2 travels through the lens component L2 to be reflected by the main mirror M1. The light reflected by the main mirror M1 then travels through the lens component L2 and the center aperture AP of the sub-mirror M2 to form the secondary image of the mask pattern at a demagnification ratio on the surface of the wafer 9. On this occasion, since the reflective surface R2 of the sub-mirror M2 is backed with the heat-sink plate 81 having the larger heat conductivity than the lens component L2, the heat generated at the reflective surface R2, which is the back reflective surface generating relatively great quantity of heat, becomes easier to escape to the heat-sink plate 81 rather than to the lens component L2. Therefore, thermal deformation or the like of the lens component L2 is reduced, whereby it becomes feasible to implement imaging with high accuracy.

Second Embodiment

The projection exposure apparatus according to the second embodiment of the present invention will be described below. Since the exposure apparatus of the present embodiment is a modification of the projection exposure apparatus of the first embodiment, the same portions will be denoted by the same reference symbols and redundant description will be omitted.

Figure 3:
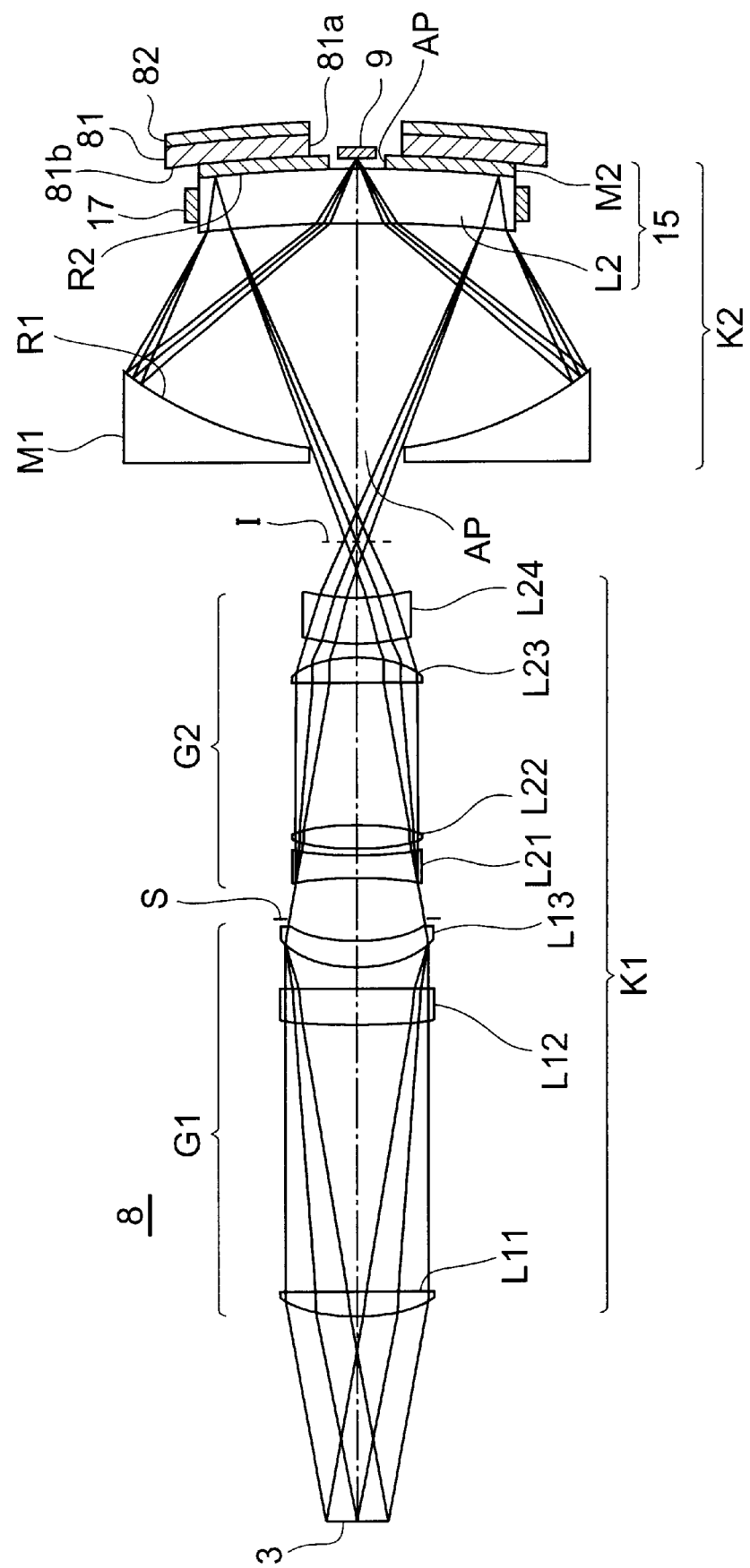
FIG. 3 shows the projection optical system of the projection exposure apparatus according to the second embodiment.

FIG. 3 is a diagram to illustrate the structure of the projection optical system 8 incorporated in the projection exposure apparatus of the second embodiment. The optical elements L11 to L13, L21 to L24, L2, M1, and M2 themselves including the lenses and others forming the projection optical system 8 are the same as those in the case of the first embodiment, but the projection optical system 8 of the present embodiment is further provided with a cooler 82 on the back face of the heat-sink plate 81 closely fitting the back face of the sub-mirror M2.

Figure 4:
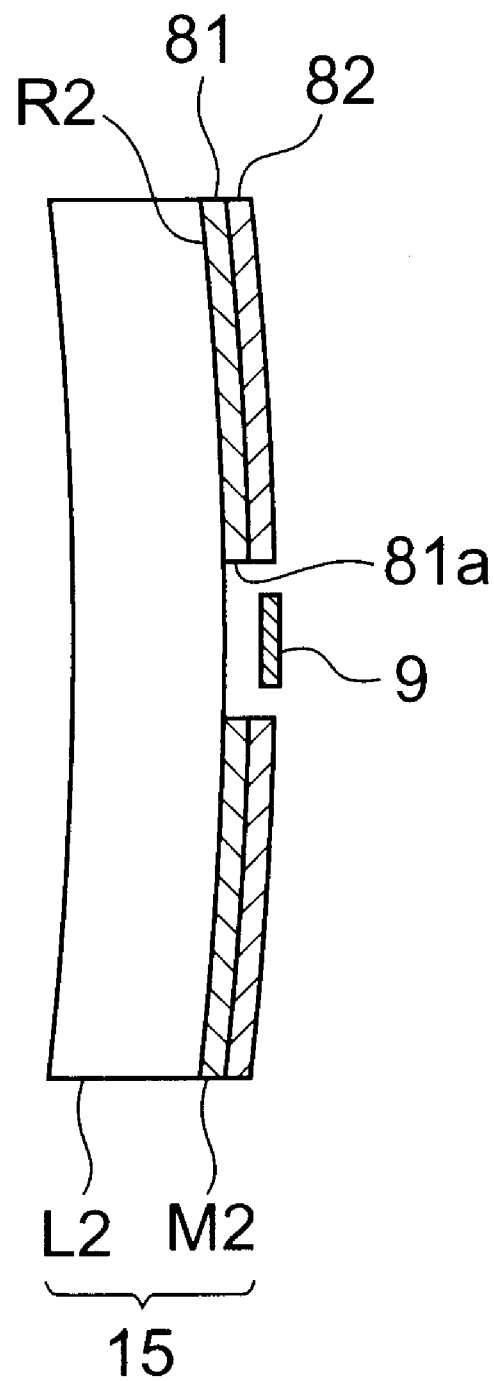
FIG. 4 is a diagram to explain the main part of the projection optical system of FIG. 3.

FIG. 4 is an enlarged view of the part around the sub-mirror M2. As also apparent from the figure, the heat-sink plate 81 as backing of the reflective surface R2 is thinner than that in the case of the first embodiment and the cooler 82 of a disk shape is attached to the back face thereof. The cooler 82 is comprised of many cooling devices, e.g., Peltier elements or the like, and acts to cool the heat-sink plate 81 from the back side. Since a temperature monitor is incorporated in the cooler 82, the heat-sink plate 81 can be quickly cooled down to a desired temperature even if it is heated up to an unexpected temperature.

Since in the projection optical system of the present embodiment the reflective surface R2 of the sub-mirror M2 is also backed with the heat-sink plate 81 having the larger heat conductivity than the lens component L2, the heat generated at the reflective surface R2 of the back reflector, which generates relatively great quantity of heat, becomes easier to escape to the heat-sink plate 81 rather than to the lens component L2. On this occasion, since the heat-sink plate 81 is always cooled to a certain temperature by the cooler 82, temperature change of the lens component L2 is further reduced, which permits imaging with high accuracy.

Third Embodiment

The projection exposure apparatus according to the third embodiment of the present invention will be described below. The exposure apparatus of the present embodiment is also a modification of the projection exposure apparatus of the first embodiment.

Figure 5:
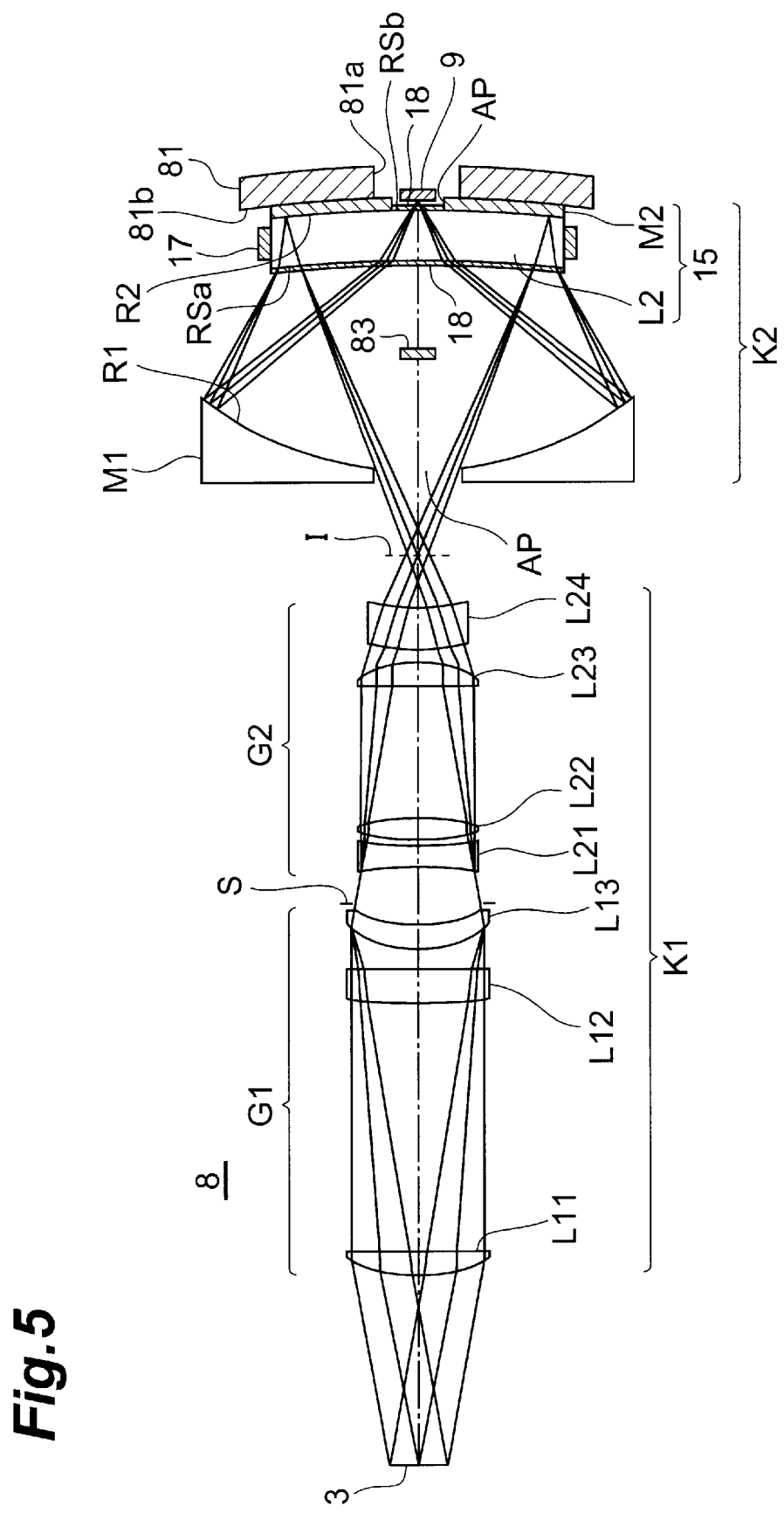
FIG. 5 is a diagram to show the projection optical system of the projection exposure apparatus according to the third embodiment.

FIG. 5 is a diagram to illustrate the structure of the projection optical system 8 incorporated in the projection exposure apparatus of the third embodiment. The optical elements L11 to L13, L21 to L24, M1, and M2 themselves including the lenses and others forming the projection optical system 8 are the same as those in the case of the first embodiment, but only a monolayer coat 18 of $MgF_2$ is laid on the mask-3-side refractive surface RSa of the lens component L2 forming the back reflector 15 and on the refractive surface RSb of the lens L2 in the aperture AP on the wafer 9 side.

Further, a shield plate 83 is interposed between the two apertures AP in order to prevent flare from appearing because of unintentional reflected light at the two refractive surfaces RSa, RSb. This shield plate 83 is positioned and fixed relative to the main mirror M1 and the sub-mirror M2 by a support member of a linear shape extending from the barrel side not illustrated.

As also apparent from the figure, the exposure light passes three times through the lens component L2 in the present embodiment. Particularly, the beam is constricted on the occasion of passage through the refractive surface RSb on the wafer 9 side. Supposing the refractive surfaces RSa, RSb being the front and back transmissive surfaces of the lens component L2 should be coated with an antireflection coat having a large absorptance, absorption by the antireflection coat on the refractive surface RSa would be three times greater than in the case of single passage and heat would be generated in relatively high surface density at the refractive surface RSb.

In order to prevent this, the absorption at the two refractive surfaces RSa, RSb is controlled to the minimum by laying only the monolayer coat 18 of $MgF_2$ on the two refractive surfaces RSa, RSb of the lens component L2 of the refracting member in the present embodiment. Without being limited to the monolayer coat, the like effect can also be achieved if the coat on the refractive surface RSa or RSb of the lens component L2 is of three or less layers. However, since the coating of the two refractive surfaces RSa, RSb with the monolayer coats 18 results in slightly increasing the quantity of flare due to unintentional reflected light, the shield plate 83 is interposed between the main mirror M1 and the sub-mirror M2 in order to avoid concentration of flare. This shield plate 83 also functions as a center shield member necessary on the optical axis for intercepting the exposure light traveling straight without being reflected by the main mirror M1 and the sub-mirror M2.

Fourth Embodiment

The projection exposure apparatus according to the fourth embodiment of the present invention will be described below. The exposure apparatus of the present embodiment is also a modification of the projection exposure apparatus of the first embodiment.

Figure 6:
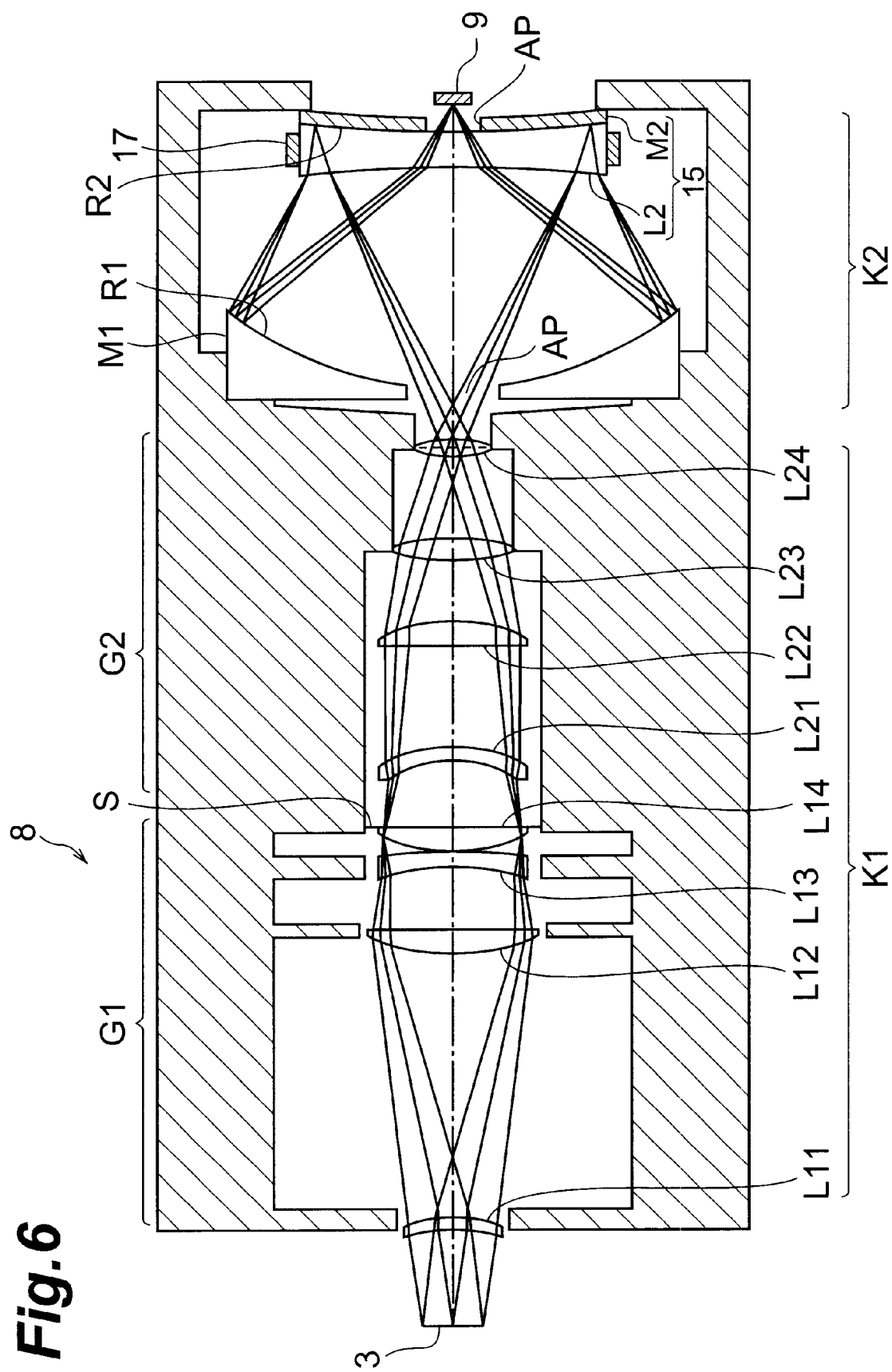
FIG. 6 is a diagram to show the projection optical system of the projection exposure apparatus according to the fourth embodiment.

FIG. 6 is a diagram to illustrate the structure of the projection optical system 8 incorporated in the projection exposure apparatus of the fourth embodiment.

The projection optical system 8 is provided with the first imaging optical system K1 of the dioptric type for forming the intermediate image of the mask 3, the second imaging optical system K2 of the catadioptric type for forming the final image of the mask 3 at a demagnification ratio on the wafer 9, based on the light from the intermediate image, and the barrel 85 for positioning and holding the first and second imaging optical systems K1, K2.

The first imaging optical system K1 is comprised of the first lens unit G1 of a positive refractive power, the aperture stop S, and the second lens unit G2 of a positive refractive power, which are arranged in the order stated from the mask 3 side, and the second imaging optical system K2 is comprised of the main mirror M1 having the front reflective surface R1 with the concave face facing to the wafer 9 side and having the aperture AP in the center, the lens component L2 as a refracting member, and the sub-mirror M2 disposed on the lens surface of the lens component L2 on the wafer 9 side and having the reflective surface R2 with the aperture AP in the center. The sub-mirror M2 and lens component L2 compose the back reflector 15.

In the projection optical system of FIG. 6, the first lens unit G1 consists of a positive meniscus lens L11 with a concave surface of an aspherical shape facing to the mask side, a positive meniscus lens L12 with a convex surface of an aspherical shape facing to the mask side, a negative meniscus lens L13 with a concave surface of an aspherical shape facing to the mask side, and a positive meniscus lens L14 with a convex surface of an aspherical shape facing to the mask side, which are arranged in the order stated from the mask side.

The second lens unit G2 consists of a negative meniscus lens L21 with a concave surface of an aspherical shape facing to the mask side, a positive meniscus lens L22 with a concave surface of an aspherical shape facing to the mask side, a biconvex lens L23 with a mask-side surface of an aspherical shape, and a biconvex lens L24 with a wafer-side surface of an aspherical shape, which are arranged in the order stated from the mask side.

Further, the lens component L2 forming the refractive portion of the back reflector 15 is constructed in the biconcave shape with a concave surface of an aspherical shape facing to the mask side. The reflective surface R2 of the sub-mirror M2 is formed in the shape with a convex surface facing to the mask side.

Here each of the lenses L11 to L13, L21 to L24 is made of fluorite, as in the case of the above first to third embodiments. The lens component L2 is also made of fluorite. Further, the main mirror M1 is made of titanium and the barrel 85 of stainless steel.

Table 1 below presents values of specifications of the projection optical system in the projection exposure apparatus of the fourth embodiment. In Table 1, λ indicates the center wavelength of the exposure light, β the projection magnification, NA the image-side numerical aperture, and φ the diameter of an image circle on the wafer. The face number represents an order of a surface of interest from the mask side along the direction of rays traveling from the mask surface of the object plane to the wafer surface of the image plane, r the radius of curvature of each surface (the radius: mm of curvature at the vertex in the case of an aspherical surface), d an axial spacing or face spacing (mm) between surfaces, and n an index of refraction for the center wavelength.

The face spacing d is defined so as to vary its sign every reflection. Accordingly, the sign of the face spacing d is negative in the optical path from the back reflective surface R2 to the front reflective surface R1, but it is positive in the other optical paths. The radius of curvature is positive for all convex surfaces but negative for all concave surfaces toward the mask side, regardless of the direction of incidence of rays.

Each aspherical surface is expressed by the following Equation (a), where y is a height in the direction normal to the optical axis, z a distance (sag amount) along the optical axis from a tangent plane at the vertex of the aspherical surface to a position on the aspherical surface at the height y, r the radius of curvature at the vertex, κ a conical coefficient, and Cn aspherical coefficients of degree n.

$$z = (y^2/r)/[1 + \{1 - (1+\kappa) \cdot y^2/r^2\}^{1/2}] + \\ C_4 \cdot y^2 + C_6 \cdot y^6 + C_8 \cdot y^8 + C_{10} \cdot y^{10} + \\ C_{12} \cdot y^{12} + C_{14} \cdot y^{14} \quad (a)$$

The lens surfaces formed in the aspherical shape are accompanied by mark * on the right side of each face number.

TABLE 1

(Main specifications)

λ = 157.6 nm
β = 0.2500
NA = 0.75
φ = 26.4 mm (Specifications of optical members)

| face No. | r | d | n |
|---|---|---|---|
|  | (mask surface) | 90.0000 |  |
| 1* | −1040.1889 | 16.8787 | 1.5600000 (lens L11) |
| 2 | −284.5252 | 441.0860 |  |
| 3* | 248.9993 | 31.6042 | 1.5600000 (lens L12) |
| 4 | 1868.1161 | 86.0264 |  |
| 5* | −256.4757 | 15.0000 | 1.5600000 (lens L13) |
| 6 | −1079.5886 | 1.0001 |  |
| 7* | 160.4237 | 39.0505 | 1.5600000 (lens L14) |
| 8 | 1268.4783 | 3.7000 |  |
| 9 | ∞ | 70.0471 | (aperture stop S) |
| 10* | −129.2757 | 15.0000 | 1.5600000 (lens L21) |
| 11 | −277.5549 | 78.6066 |  |
| 12* | −1494.7189 | 45.0000 | 1.5600000 (lens L22) |
| 13 | −238.2212 | 91.8347 |  |
| 14* | 365.9254 | 18.9298 | 1.5600000 (lens L23) |
| 15 | −701.6534 | 129.1513 |  |
| 16 | 4243.7172 | 16.9695 | 1.5600000 (lens L24) |
| 17* | −216.4772 | 290.1728 |  |
| 18* | −2125.3388 | 59.9425 | 1.5600000 (lens component L2) |
| 19 | 5996.9618 | −59.9425 | 1.5600000 (back reflective surface R2) |
| 20* | −2125.3388 | −230.3293 |  |
| 21 | 350.1412 | 230.3293 | 1.5600000 (front reflective surface R1) |
| 22* | −2125.3388 | 59.9425 | 1.5600000 (lens component L2) |
| 23 | 5996.9618 | 10.0000 |  |
|  | (wafer surface) |  |  |

(Data of aspherical surfaces)

| | r | κ | C4 |
|---|---|---|---|
| 1st surface | −1040.1889 | 0.00000 | $8.50114 \times 10^{-9}$ |
|  | C6 | C8 | C10 |
|  | $9.40854 \times 10^{-14}$ | $3.85092 \times 10^{-18}$ | $-5.46679 \times 10^{-22}$ |
|  | C12 | C14 |  |
|  | 0.00000 | 0.00000 |  |
|  | r | κ | C4 |
| 3rd surface | 248.9993 | 0.00000 | $-1.42904 \times 10^{-10}$ |
|  | C6 | C8 | C10 |
|  | $6.60616 \times 10^{-14}$ | $3.65786 \times 10^{-18}$ | $-1.09842 \times 10^{-22}$ |
|  | C12 | C14 |  |
|  | $4.97484 \times 10^{-27}$ | 0.00000 |  |
|  | r | κ | C4 |
| 5th surface | −256.4757 | 0.00000 | $5.80903 \times 10^{-9}$ |
|  | C6 | C8 | C10 |
|  | $1.21604 \times 10^{-13}$ | $1.20391 \times 10^{-17}$ | $1.45440 \times 10^{-22}$ |
|  | C12 | C14 |  |
|  | $6.87071 \times 10^{-27}$ | 0.00000 |  |

TABLE 1-continued

| | r | κ | $C_4$ |
|---|---|---|---|
| 7th surface | 160.4237 | 0.00000 | $-6.83384 \times 10^{-9}$ |
| | $C_6$ | $C_8$ | $C_{10}$ |
| | $5.93636 \times 10^{-13}$ | $6.46685 \times 10^{-18}$ | $5.93586 \times 10^{-22}$ |
| | $C_{12}$ | $C_{14}$ | |
| | $9.08641 \times 10^{-26}$ | 0.00000 | |
| | r | κ | $C_4$ |
| 10th surface | $-129.2757$ | 0.00000 | $-1.19158 \times 10^{-8}$ |
| | $C_6$ | $C_8$ | $C_{10}$ |
| | $5.20234 \times 10^{-12}$ | $1.68410 \times 10^{-16}$ | $6.16591 \times 10^{-21}$ |
| | $C_{12}$ | $C_{14}$ | |
| | $-3.28458 \times 10^{-25}$ | 0.00000 | |
| | r | κ | $C_4$ |
| 12th surface | $-1494.7189$ | 0.00000 | $3.04547 \times 10^{-8}$ |
| | $C_6$ | $C_8$ | $C_{10}$ |
| | $-2.21766 \times 10^{-12}$ | $1.10527 \times 10^{-16}$ | $-3.25713 \times 10^{-21}$ |
| | $C_{12}$ | $C_{14}$ | |
| | $1.29445 \times 10^{-25}$ | 0.00000 | |
| | r | κ | $C_4$ |
| 14th surface | 365.9254 | 0.00000 | $-3.76800 \times 10^{-8}$ |
| | $C_6$ | $C_8$ | $C_{10}$ |
| | $1.05958 \times 10^{-13}$ | $-2.08225 \times 10^{-17}$ | $1.53887 \times 10^{-21}$ |
| | $C_{12}$ | $C_{14}$ | |
| | $-1.62147 \times 10^{-25}$ | 0.00000 | |
| | r | κ | $C_4$ |
| 17th surface | $-216.4772$ | 0.00000 | $1.07160 \times 10^{-8}$ |
| | $C_6$ | $C_8$ | $C_{10}$ |
| | $-1.20868 \times 10^{-13}$ | $-2.81385 \times 10^{-18}$ | $2.81683 \times 10^{-21}$ |
| | $C_{12}$ | $C_{14}$ | |
| | 0.00000 | 0.00000 | |
| | r | κ | $C_4$ |
| 18th surface 20th surface 22nd surface | $-2125.3388$ | 91.723346 | $5.77862 \times 10^{-10}$ |
| | $C_6$ | $C_8$ | $C_{10}$ |
| | $-2.56941 \times 10^{-14}$ | $1.81191 \times 10^{-18}$ | $-4.17947 \times 10^{-23}$ |
| | $C_{12}$ | $C_{14}$ | |
| | $1.10317 \times 10^{-27}$ | $-1.11337 \times 10^{-32}$ | |

The following will describe a means for avoiding the heterogeneous temperature distribution appearing in the lens component L2 of the back reflector 15. In the back reflector 15 consisting of the lens component L2 and the sub-mirror M2, there exists transmitted light and reflected light; the transmitted light passes an axial region inside the aperture AP, while the reflected light passes outside the aperture AP. In this case, if the surface density of the transmitted light were extremely larger than that of the reflected light, the temperature would increase only near the optical axis where the transmitted light is absorbed, so as to cause index irregularities, which is not preferable. It can be prevented by such setting that the surface density of the transmitted light at the transmissive surface is not extremely larger than that of the reflected light at the reflective surface.

Here, let $\phi1$ be an effective radius at incidence to the reflective surface R2 of the lens component L2, S1 be an absorptance of the reflective surface R2, $\phi2$ be an effective radius at incidence to the transmissive surface corresponding to the aperture AP, and S2 be an absorptance of the transmissive surface corresponding to the aperture AP. Further, let E1 be the total energy incident to the lens component L2 immediately before reflection, and the entrance surface thereof is assumed to be approximately circular. Then the surface density DR of heat generated at the reflective surface R2 is given by the following:

$$DR = E1 \times S1 / \pi(\phi1^2 - \phi2^2).$$

The surface density DT of heat generated at the transmissive surface corresponding to the aperture AP is given by the following:

$$DT = E2 \times S2 / \pi\phi2^2,$$

where E2 is the total energy incident to the lens component L2 immediately before transmission. Here it can be assumed that E1≈E2, though there is a slight difference, depending upon intermediate absorption. Then a relation of DT<3DR can be set as a condition for keeping the surface density DT of heat generated at the transmissive surface corresponding to the aperture AP from becoming extremely larger than the surface density DR of heat generated at the reflective surface R2. If the following relation is met:

$$S2/\phi2^2 < 3S1/(\phi1^2 - \phi2^2) \tag{1},$$

surface average heating values will become approximately equal at the reflective surface R2 and at the transmissive surface of the aperture AP, whereby the heterogeneous temperature distribution can be prevented from appearing in the lens component L2.

In the optical system of the above embodiment, the effective radius $\phi1$ of the reflective surface R2 is 125 mm and the effective radius $\phi2$ of the aperture AP is 26 mm. The absorptance S1 upon reflection is 10% and the absorptance upon transmission is 1%. Therefore, the right-hand side concerning the reflective surface turns out to be $3S1/(\phi1^2 - \phi2^2) = 1/49830$ and the left-hand side concerning the transmissive surface to be $S2/\phi2^2 = 1/67600$. The optical system of the present embodiment thus satisfies above Relation (1).

Next described is a means for reducing influence on the focus state from increase in the temperature of the whole of the projection optical system 8 including the lens component L2 and others.

If all the elements constituting the projection optical system 8 expand or expand/contract at an equal ratio with change in the temperature of the entire projection optical system 8, the focusing characteristics of the projection optical system 8 will not vary even with deviation of the focus position. Specifically, where α represents the coefficient of thermal expansion, (dL/L)/dT, of the barrel 85 making the projection optical system 8, if the expansion coefficient β of the material making at least one to all the optical elements, particularly, the reflector, satisfies the following condition:

$$\alpha/3 < \beta < 3\alpha, \alpha \neq \beta \tag{2},$$

the aberration variation due to temperature change can be considered to become relatively small.

In general, conceivable effects with change in the temperature of the entire projection optical system include an effect of expansion of the barrel itself holding the refracting members, an effect of change in the refractive indexes due to the temperature change of the refracting members, and an effect of change in the shape due to expansion of the refracting members. For that reason, combination of these factors gives rise to aberrations in dioptric optics. However, the reflective surfaces often determine the demagnification ratio in the catadioptric optics like that in the present embodiment. In such optics, the effect of the refracting members is weaker than that of the reflective surfaces, and the reflective surfaces and barrel determine most of the effects of temperature change. In such cases, if the expansion coefficients of the barrel material and the reflector material are close to each other, the projection optical system will simply expand as a whole even with temperature change of the whole and thus there will appear little aberration by adjusting only the position of the object and the position of the image. However, the barrel itself is desired to be made of a material as strong as possible, and thus applicable materials are limited.

As seen from the above consideration, the aberration variation due to temperature can be reduced by selecting the materials so that the expansion coefficient of the material making the main mirror M1 (preferably, the main mirror M1 and the lens component L2) is close to that of the material making the barrel 85 so as to satisfy above Condition (2). If above Condition (2) is not met, the difference will be large between the expansion coefficients of the reflecting member and the barrel member and there will appear greater aberration with change in temperature.

More desirably, the expansion coefficient β of the material making the reflector satisfies the following condition:

$$\alpha/2 < \beta < 2\alpha, \ \alpha \neq \beta \quad (3),$$

whereby the temperature variation is more reduced, which is preferable.

In the optical system of the above embodiment, the barrel 85 is made of stainless steel and the coefficient of linear expansion thereof is 14.7 ppm/K. On the other hand, the main mirror M1 is made of titanium and an aluminum film is evaporated thereon for reflection. Here the coefficient of linear expansion of titanium is 8.6 ppm/K and thus above Condition (2) is met. This can decrease the aberration variation even with change in the temperature of the entire projection optical system 8. The lens component L2 forming the back reflector 15 is made of fluorite and the coefficient of linear expansion thereof is 19 ppm/K. It also satisfies Condition (2), but the effect of temperature change of the lens component L2 is weaker than in the case of the main mirror M1, because the main mirror M1 predominantly determines the magnification in the projection optical system 8 of this embodiment.

Fifth Embodiment

FIG. 7 is an enlarged view of the part around the back reflector 15 (M2, L2) of the projection optical system in the projection exposure apparatus according to the fifth embodiment. In the present embodiment, a heat-transfer member H is spaced 3 mm apart from the back of the reflective surface of the back reflector 15 and arranged approximately along the shape of the back reflector 15. The curvature of the heat-transfer member H does not have to coincide perfectly with that of the reflective surface of the back reflector 15 and it is preferable to keep the distance not more than 30 mm between the back reflector 15 and the heat-transfer member H throughout the entire surface. Since the present embodiment employs the exposure light of 157 nm, the back reflector 15 is made of fluorite. It is preferable to make the heat-transfer member H of a material with a relatively high heat conductivity, e.g., brass, an aluminum alloy, a titanium alloy, or the like. In the present embodiment, the heat-transfer member H is made of brass. The heat-transfer member H is further connected to a member with a relatively high heat conductivity and with a large heat capacity, such as an unrepresented body or the like, so as to prevent the heat-transfer member itself from increasing its temperature. The space between the back reflector 15 and the heat-transfer member H is filled with a gas having a relatively high heat conductivity. This gas can be preferably selected, for example, from helium (He), nitrogen ($N_2$), and so on.

In the present embodiment, since the space between the back reflector 15 and the heat-transfer member H is considerably small with the gas in between, the heat of the back reflector 15 can be radiated to the heat-transfer member H with little thermal resistance of the gas. Therefore, the heat can be prevented from accumulating inside the back reflector 15, whereby it becomes feasible to implement highly accurate exposure with less aberration variation.

Sixth Embodiment

FIG. 8 is an enlarged view of the part around the reflector M1 of the projection optical system in the projection exposure apparatus according to the sixth embodiment. In the present embodiment, the heat-transfer member H is disposed 5 mm apart from the back side of the reflector M1 and arranged approximately along the shape of the reflector M1. The curvature of the heat-transfer member H does not have to coincide perfectly with that of the reflective surface of the back reflector M1, and it is preferable to set the distance not more than 30 mm between the reflector M1 and the heat-transfer member H throughout the entire surface. In the present embodiment the exposure light is of 157 nm, and the material of the reflector is BK7 in consideration of the compatibility with the reflective film. The heat-transfer member H is preferably made of a material with a relatively high heat conductivity and is made of stainless steel in the present embodiment. The heat-transfer member H is further connected to an unrepresented forced cooling means, e.g., a water cooler or the like, so as to prevent the heat-transfer member itself from increasing its temperature. The space between the back reflector M1 and the heat-transfer member H is filled with nitrogen of high purity.

The projection exposure apparatus of the first to sixth embodiments described above can be fabricated according to the following method.

First prepared is the illumination optical system 2 for illuminating the pattern on the mask 3 with the illumination light of the center wavelength shorter than 180 nm. Specifically, the illumination optical system 2 is prepared as one for illuminating the mask pattern with the $F_2$ laser light with the center wavelength of 157.6 nm, for example. At this time, the illumination optical system 2 is constructed to supply the illumination light of a spectral width within a predetermined full width at half maximum.

Next prepared is the projection optical system 8 for focusing the image of the pattern on the mask, on the photosensitive surface of the photosensitive substrate. The preparation of the projection optical system 8 includes preparation of the plurality of refracting optical elements, the reflectors, etc. and assembly of these refracting optical elements and others. Then the projection optical apparatus according to each embodiment can be fabricated by electrically, mechanically, or optically coupling these illumination optical system 2 and projection optical system 8 with each other so as to attain the aforementioned function.

In each of the embodiments described above, the material of the refracting optical members constituting the projection optical system was fluorite or $CaF_2$ (calcium fluoride), but it is also possible to use either one selected from crystal materials of fluorides, e.g., barium fluoride, lithium fluoride, magnesium fluoride, and so on, and fluorine-doped silica, in addition to $CaF_2$ or instead of $CaF_2$. However, it is preferable to make the projection optical system of a single kind of optical material if the illumination light to illuminate the mask can be of a sufficiently narrowed band. Further, it is preferable to make the projection optical system of only $CaF_2$ in consideration of easiness of fabrication and fabrication cost of the projection optical system. It is also possible to select the material of the refracting optical members in view of the coefficient of linear expansion.

Further, each of the above embodiments employed the $F_2$ laser as the light source 1 and was arranged to narrow the spectral width thereof by a band-narrowing device, but instead thereof, the apparatus may also be arranged to use a harmonic of a solid state laser such as YAG lasers having the lasing spectrum at 157 nm. It can also be contemplated to use a harmonic obtained by amplifying laser light of a single wavelength in the infrared region or in the visible region from a DFB semiconductor laser or a fiber laser, for example, by a fiber amplifier doped with erbium (or with both erbium and ytterbium) and converting the wavelength into ultraviolet light by use of a nonlinear optical crystal. For example, an ytterbium-doped fiber laser is used as the single-wavelength-lasing laser.

When the harmonic from the laser light source is adopted in this way, it can be used instead of the light source 1 of each embodiment described above, because the harmonic itself has a sufficiently narrowed spectral width (for example, about 0.01 pm).

The present invention can be applied to the step-and repeat method (one-shot exposure method) of transferring the mask pattern image into one shot area on the wafer by one shot, thereafter sequentially two-dimensionally moving the wafer in the plane perpendicular to the optical axis of the projection optical system 8, and then transferring the mask pattern image into the next shot area by one shot and to the step-and-scan method (scanning exposure method) of synchronously scanning the mask and wafer at a speed ratio equal to the projection magnification β relative to the projection optical system 8 during exposure into each shot area of wafer. Since in the step-and-scan method the good focus condition is necessary only in the exposure area of a slit shape (a long rectangular shape), the exposure can be effected in a wider shot area on the wafer without increase in the scale of the projection optical system 8.

Exposure Method

Figure 9:
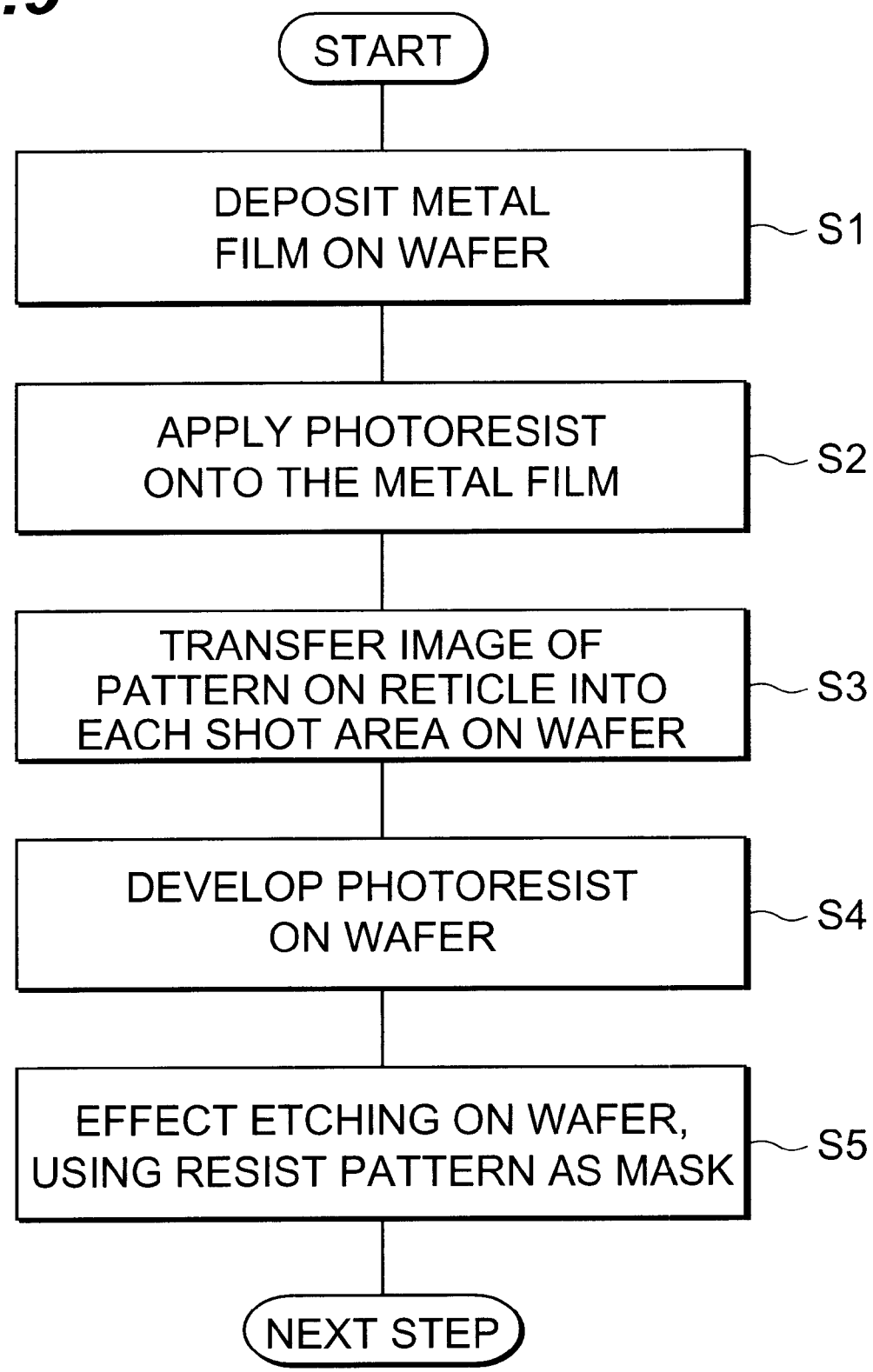
FIG. 9 is a flowchart to show an example of operation for forming a predetermined circuit pattern by use of the projection exposure apparatus according to the first to sixth embodiments.

Next described with reference to the flowchart of FIG. 9 is an example of operation for forming the predetermined circuit pattern on the wafer by the step-and-scan method with the projection exposure apparatus of each embodiment described above.

The first step S1 of FIG. 9 is a step of evaporating a metal film on a wafer of one lot. Step S2 is a step of laying a photoresist on the metal film on the wafer 9 of one lot. After that, step S3 is a step of successively transferring the image of the pattern on the reticle 3 through the projection optical system 8 into each shot area on the wafer 9 of one lot by use of the projection exposure apparatus of FIG. 1 provided with the projection optical system 8 of each embodiment. Then step S4 is a step of developing the photoresist on the wafer 9 of one lot and step S5 thereafter is a step of conducting etching on the wafer 9 of one lot, using the resist pattern as a mask, thereby forming a circuit pattern corresponding to the pattern on the reticle R, in each shot area on each wafer. After that, devices such as the semiconductor devices or the like are fabricated through formation of circuit patterns of layers further above it, and so on.

Incidentally, the present invention was applied to the projection exposure apparatus used in the fabrication of the semiconductor devices in each of the above embodiments. However, without having to be limited to the exposure systems used in the fabrication of the semiconductor devices, the present invention can also be applied to exposure systems for transferring a device pattern onto a glass plate, used in fabrication of displays including liquid-crystal display devices or the like, exposure systems for transferring a device pattern onto a ceramic wafer, used in fabrication of thin-film magnetic heads, exposure systems used in fabrication of image pickup devices (CCDs etc.), and so on. The present invention can also be applied to exposure systems for transferring a circuit pattern onto a glass substrate or a silicon wafer or the like for fabrication of a reticle or mask.

Seventh Embodiment

The projection exposure apparatus according to the seventh embodiment of the present invention will be described below.

Figure 10:
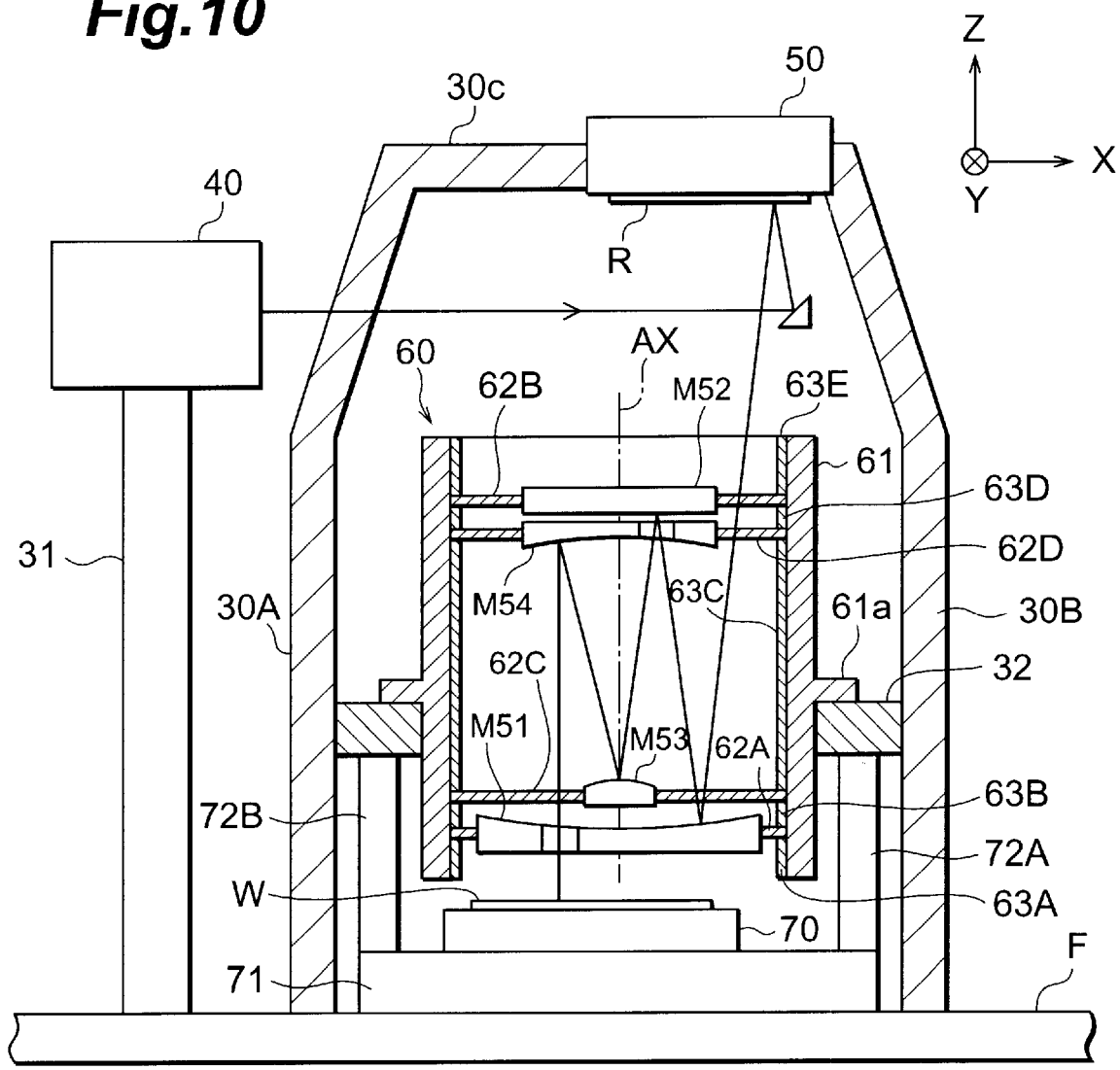
FIG. 10 is a diagram to show the projection optical system of the projection exposure apparatus according to the seventh embodiment.

FIG. 10 schematically shows the projection exposure apparatus according to the seventh embodiment. This projection exposure apparatus uses light emitted in the soft X-ray region (EUV light) as the exposure light and a catoptric system consisting of only reflective surfaces as the projection optical system.

For supporting this projection exposure apparatus, columns 30A, 30B and column 31 are fixed on the floor F. The upper portions of the two columns 30A, 30B are connected by a ceiling plate 30C. The illumination system 40 is supported by the column 31. The ceiling plate 30C connected to the upper portions of the columns 30A, 30B supports a reticle stage base not illustrated, and a reticle stage system 50 is mounted on this reticle stage base so as to be movable along the X-direction in the figure.

A support plate 32 connected slightly below the center of the columns 30A and 30B has an aperture in the center. The projection optical system 60 is supported through a flange 61a provided on the barrel 61 of the projection optical system 60 in the aperture of the support plate 32.

A wafer surface plate 71 carrying a wafer stage system 70 is connected through arms 72A, 72B to the support plate 32. The wafer stage system 70 is also movable along the X-direction in the figure.

The projection optical system 60 has four mirrors M51 to M54 arranged along the optical axis AX and these mirrors M51 to M54 are held by respective mirror holders 62A to 62D. For positioning of each mirror M51 to M54 in the direction of the optical axis AX, spacers 63A to 63E are provided for determining spacings between the mirror holders 62A to 62D. Inside the barrel 61, the mirror holders 62A to 62D and spacers 63A to 63E are alternately stacked.

The operation of the entire projection optical apparatus will be described. The EUV light from the illumination system 40 is incident to the reticle R subjected to scanning by the reticle stage system 50. The reflected light from the reticle R is incident to the projection optical system 60 and passes via the mirrors M51 to M54 to impinge upon the wafer W, whereupon a reduced image of the reticle R is projected onto the wafer W. On this occasion, the wafer stage system 70 is also moved in synchronism with the motion of the reticle R, so as to implement scanning exposure.

In the present embodiment, each of the mirrors M51 to M54 is made, for example, of beryllium and the barrel 61, mirror holders 62A to 62D, and spacers 63A to 63E are made, for example, of brass.

The columns 30A, 30B, ceiling plate 30C, support plate 32, and arms 72A, 72B, which indirectly position the reticle R in the direction of the optical axis AX by supporting the reticle stage system 50 and which indirectly position the wafer W in the direction of the optical axis AX by supporting the wafer stage system 70, are made, for example, of stainless steel.

Here the coefficient of linear expansion of beryllium, which is the material of the mirrors M51 to M54, is 11.3 ppm/K. The coefficient of linear expansion of brass, which is the material of the members including the barrel 61 and others for positioning the mirrors M51 to M54 in the direction of the optical axis AX, is 17.5 ppm/K. Further, the coefficient of linear expansion of stainless steel, which is the material of the members including the columns 30A, 30B and others for positioning the reticle R and the wafer W in the direction of the optical axis AX, is 14.7 ppm/K.

Namely, the material of the mirrors M51 to M54 is different from the material of the barrel 61 and others, but they satisfy Conditions (2), (3) described in the fourth embodiment, so as to be able to reduce the aberration variation due to temperature change.

Conditions (2), (3) are also met by the columns 30A, 30B and others for positioning the reticle R and wafer W. This permits the aberration variation due to temperature change to be reduced without moving the object-to-image distance by the reticle stage system 50 and the wafer stage system 70.

Although the above described that the material of the mirrors M51 to M54, the material of the barrel 61 and others, and the material of the columns 30A, 30B and others satisfied Conditions (2), (3), the apparatus can also be constructed in such structure that Conditions (2), (3) are not met by the material of the mirrors M51 to M54 and the material of the members including the barrel 61 and others for positioning these mirrors M51 to M54 in the direction of the optical axis AX. In this case, a temperature sensor for detecting temperature variation of the mirrors M51 to M54 is disposed in the projection optical system 60, and at least one of the reticle stage system 50 and the wafer stage system 70 is driven based on output data of this temperature sensor, to change the object-to-image distance to a distance capable of reduction in the aberration variation. This structure can also reduce the aberration variation due to temperature change.

Eighth Embodiment

Figure 11:
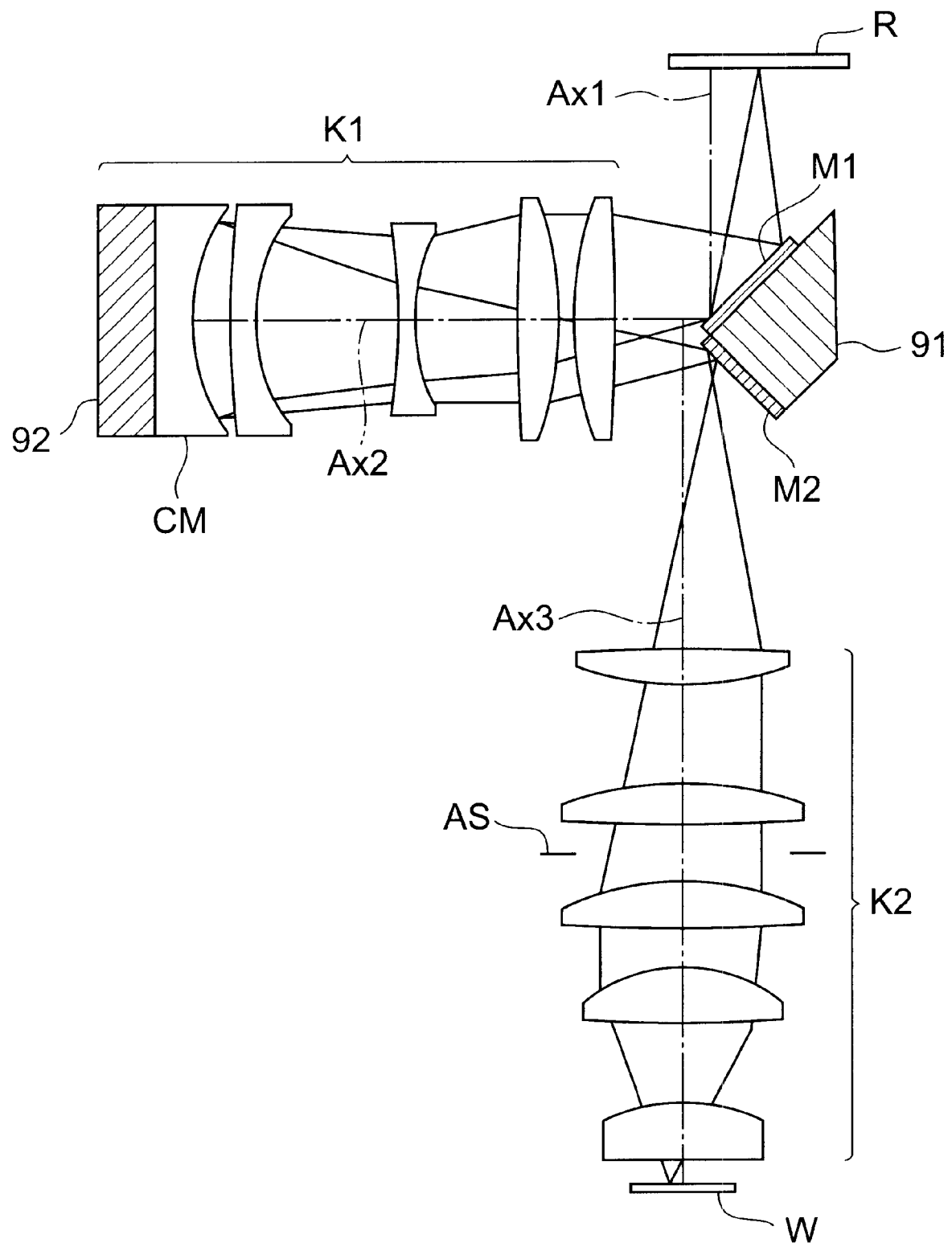
FIG. 11 is a diagram to show the structure of the projection exposure apparatus according to the eighth embodiment of the present invention.

FIG. 11 is a diagram to schematically show the overall structure of the projection exposure apparatus according to the eighth embodiment of the present invention. The present embodiment is a modification of the first embodiment.

As illustrated in FIG. 11, the projection optical system has the first imaging optical system K1 of the catadioptric type for forming the intermediate image of the pattern on the reticle R as a projection plate, and the second imaging optical system K2 of the dioptric type for refocusing the image of the intermediate image focused by the first imaging optical system K1, on the wafer W as a work. Here a reflector M1 with a reflective surface for folding of the optical path, which is provided for deflecting the optical path by 90°, is disposed in the optical path between the reticle R and the first imaging optical system K1, and a reflector M2 with a reflective surface for folding of the optical path, which is provided for deflecting the optical path by 90°, is disposed in the optical path between the first imaging optical system K1 and the second imaging optical system K2, i.e., in the vicinity of the intermediate image. These reflectors M1, M2 are placed on a heat-sink member 91 having a larger heat conductivity than the reflectors M1, M2.

The first imaging optical system K1 has a plurality of lens components and a concave reflector CM arranged along the optical axis Ax2 and forms the intermediate image at an approximately 1:1 ratio or at a slight reduction ratio. A heat-sink plate 92 having a larger heat conductivity than the concave mirror CM is set in contact with the concave mirror CM.

The second imaging optical system K2 is provided with a plurality of lens components and a variable aperture stop AS for controlling the coherence factor, which are arranged on and along the optical axis Ax3 perpendicular to the optical axis Ax2, and forms the image of the intermediate image, i.e., the secondary image at a demagnification ratio, based on the light from the intermediate image.

Here the optical axis Ax2 of the first imaging optical system K1 is folded 90° by the reflector M1 for folding of the optical path, to define the optical axis Ax1 between the reticle R and the reflector M1. In the present embodiment, the optical axis Ax1 and the optical axis Ax3 are parallel to each other, but are not coincident with each other.

In the present embodiment, a single lens component or a plurality of lens components may be placed along the optical axis Ax1. It can also be contemplated that the optical axis Ax1 and the optical axis Ax3 are arranged to coincide with each other. It can also be contemplated that the angle between the optical axis Ax1 and the optical axis Ax2 is set to another angle different from 90° and, preferably, the concave reflector CM is set at an angle resulting from counterclockwise rotation. In this case, it is preferable to set the angle of folding of the optical axis at the reflective surface M2 so as to keep the reticle R and the wafer W in parallel.

Since in the present embodiment the heat-sink plate 92 abuts on the concave mirror CM and the heat-sink member 91 on the reflectors M1, M2 as described above, the heat generated at the concave mirror CM and at the reflectors M1, M2 becomes easier to escape each to the heat-sink member 91 and to the heat-sink plate 92. This decreases thermal deformation or the like of the concave mirror CM and the reflectors M1, M2 and thus enables imaging with high accuracy.

Further, the present embodiment may be arranged to attach a cooler as a forced cooling means to the heat-sink member 91 and to the heat-sink plate 92, as in the second embodiment.

Ninth Embodiment

Figure 12:
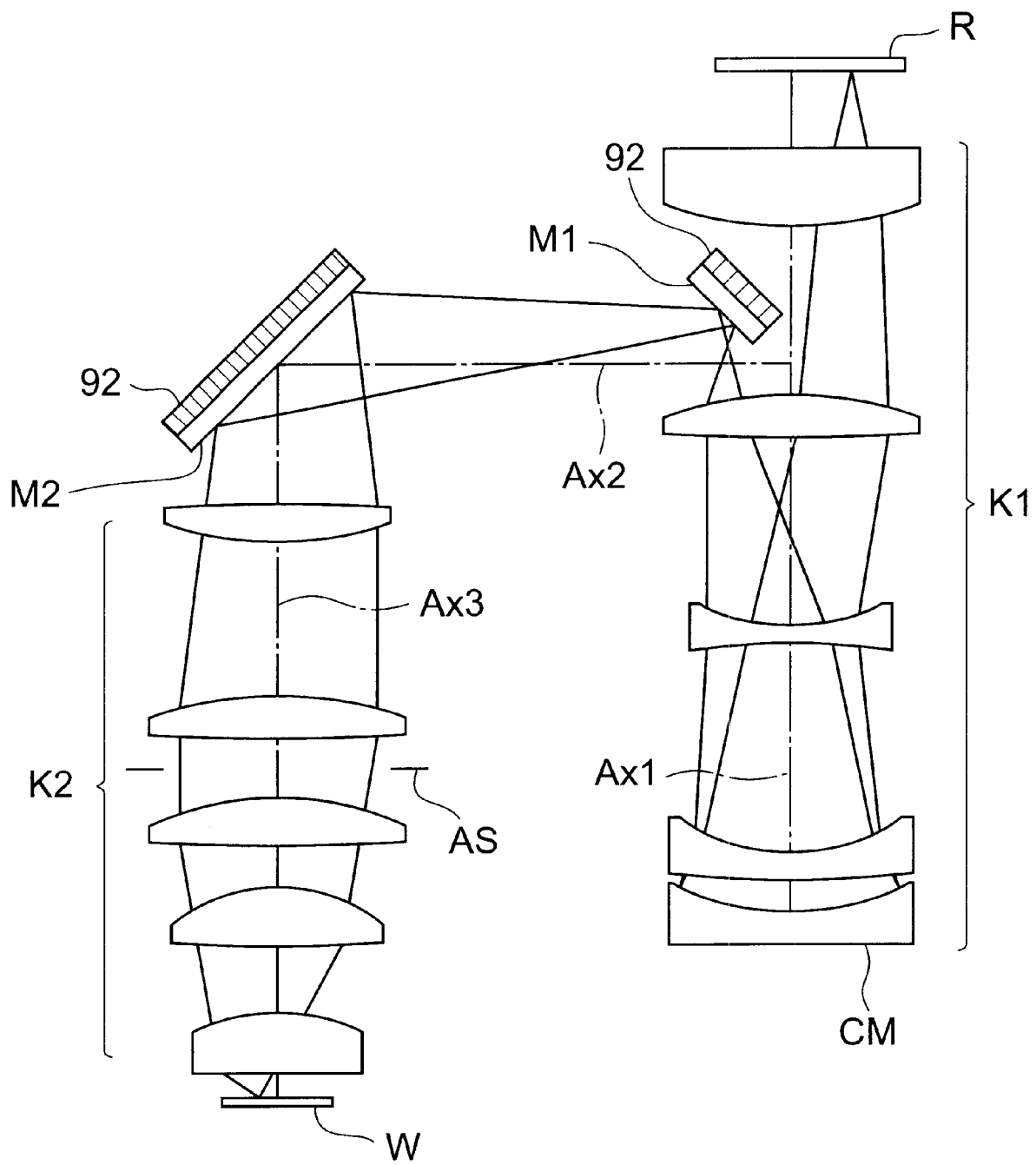
FIG. 12 is a diagram to show the structure of the projection exposure apparatus according to the ninth embodiment of the present invention.

FIG. 12 is a diagram to schematically show the overall structure of the projection exposure apparatus according to the ninth embodiment of the present invention. The present embodiment is a modification of the first embodiment.

As illustrated in FIG. 12, the projection optical system of the present embodiment has the first imaging optical system K1 of the catadioptric type for forming the intermediate image of the pattern on the reticle R as a projection plate, and the second imaging optical system K2 of the dioptric type for refocusing the image of the intermediate image focused by the first imaging optical system K1, on the wafer W as a work. Here a reflector M1 with a reflective surface for folding of the optical path, which is for deflecting the optical path by 90°, and a reflector M2 with a reflective surface for folding of the optical path, which is for deflecting the optical path by 90°, are arranged in the optical path between the first imaging optical system K1 and the second imaging optical system K2. Further, the reflector M1 and the reflector M2 are kept in contact with respective heat-sink plates 92.

The first imaging optical system K1 has a plurality of lens components and a concave mirror CM arranged along the optical axis Ax1 and forms the intermediate image of the reticle R at an almost 1:1 ratio or at a slight reduction ratio in the vicinity of the reflective surface 1 as the first path-folding mirror. The second imaging optical system K2 has a plurality of lens components arranged along the optical axis Ax3 and forms the image of the intermediate image (i.e., the secondary image) at a reduction ratio on the wafer W, based on the light from the intermediate image. Since the reflector M1 and reflector M2 are arranged at respective angles perpendicular to each other, the optical axes Ax1, Ax3 of the first and second imaging optical systems K1, K2 are parallel to each other and the reticle R and the wafer W are also parallel to each other.

In the present embodiment, a single lens component or a plurality of lens components may be placed along the optical axis Ax2 in the optical path between the reflectors M1, M2 for folding of the optical path.

Since in the present embodiment the heat-sink plates 92 abut on the respective reflectors M1, M2 as described above, the heat generated at the reflectors M1, M2 becomes easier to escape to the respective heat-sink plates 92. This reduces the thermal deformation or the like of the reflectors M1, M2, so as to enable imaging with high accuracy.

Further, the present embodiment may also be arranged to provide the heat-sink plates 92 each with a cooler as a forced cooling means, as in the second embodiment.

Tenth Embodiment

Figure 13:
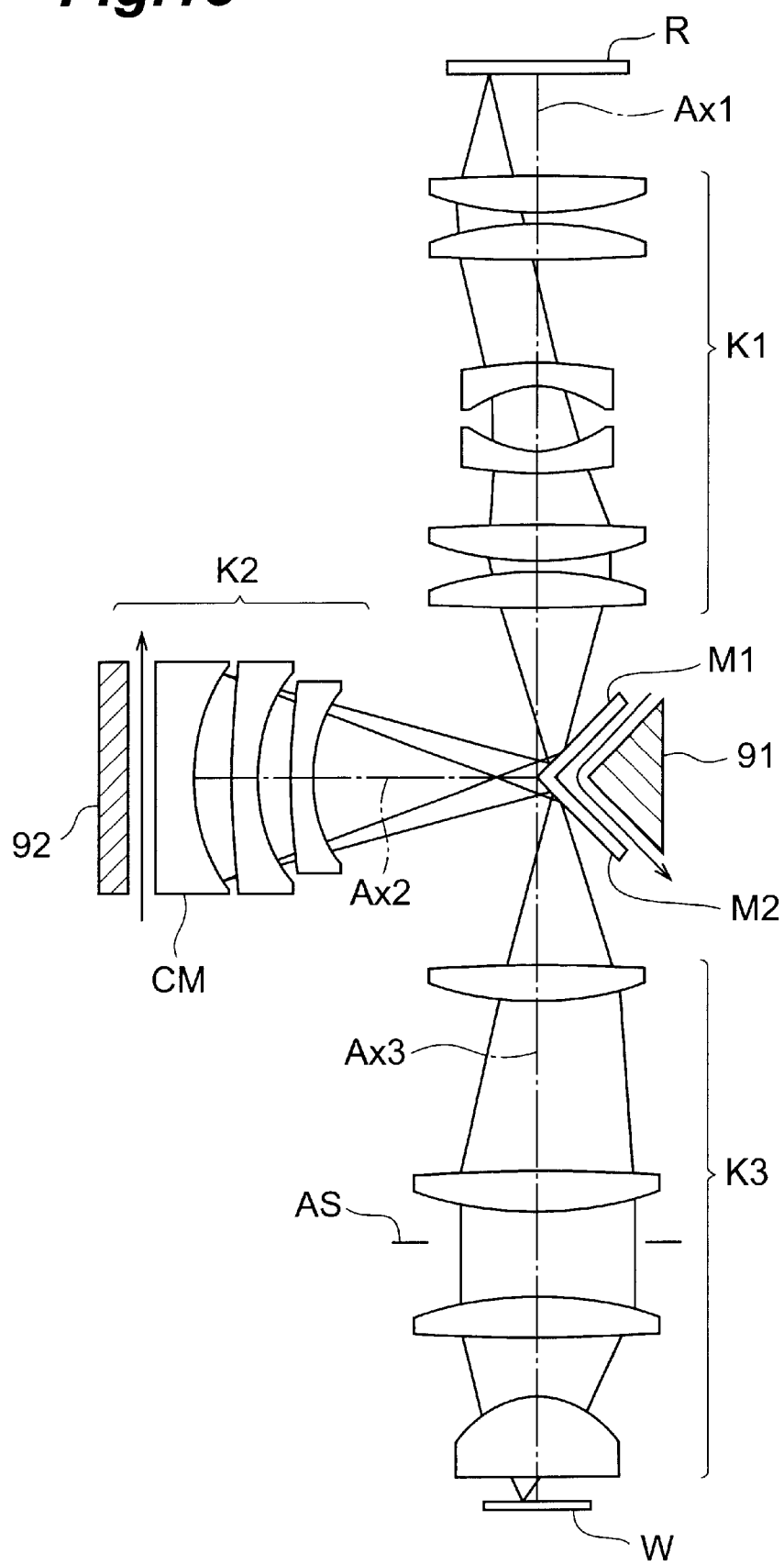
FIG. 13 is a diagram to show the structure of the projection exposure apparatus according to the tenth embodiment of the present invention.

FIG. 13 is a diagram to schematically show the overall structure of the projection exposure apparatus according to the tenth embodiment of the present invention. The present embodiment is a modification of the sixth embodiment.

As illustrated in FIG. 13, the projection optical system of the present embodiment has the first imaging optical system K1 of the dioptric type for forming the intermediate image of the pattern on the reticle R as a projection plate, the second imaging optical system K2 of the catadioptric type for refocusing the image of the intermediate image (i.e., the secondary image) focused by the first imaging optical system K1, and a third imaging optical system K3 of the dioptric type for refocusing the secondary image focused by the second imaging optical system K2, on the wafer W as a work. Here a reflector M1 with a reflective surface for folding of the optical path, which is for deflecting the optical path by 90°, is disposed in the optical path between the first imaging optical system K1 and the second imaging optical system K2, and a reflector M2 with a reflective surface for folding of the optical path, which is for deflecting the optical path by 90°, is disposed in the optical path between the second imaging optical system K2 and the third imaging optical system K3.

A heat-sink member 91 is disposed at the distance of not more than 30 mm from the reflector M1 and the reflector M2. Helium gas is allowed to flow through the gap between the reflectors M1, M2 and the heat-sink member 91.

The first imaging optical system K1 has a plurality of lens components arranged along the optical axis Ax1 and forms the intermediate image at a reduction ratio of about 1/1.5 to about 1/3.

The second imaging optical system K2 has a single lens component or a plurality of lens components and a concave mirror CM arranged along the optical axis Ax2 and forms the image (secondary image) of the intermediate image focused by the first imaging optical system, at an almost 1:1 ratio. Then a heat-sink plate 92 is set at the distance of not more than 30 mm from the concave mirror CM. The apparatus is also arranged to allow helium gas to flow through the gap between the concave mirror CM and the heat-sink plate 92.

The third imaging optical system K3 has a plurality of lens components arranged along the optical axis Ax3 and forms an image (tertiary image) of the secondary image focused by the first and second imaging optical systems K1, K2, at a reduction ratio of about 1/1.5 to about 1/3 on the wafer W.

Although in the present embodiment the optical axis Ax1 and the optical axis Ax3 are coincident with each other, the optical axis Ax1 and the optical axis Ax3 can be parallel and not coincident with each other and the optical axis Ax2 does not have to be perpendicular to the optical axis Ax1 or Ax3.

Since in the present embodiment the distance between the reflectors M1, M2 and the heat-sink member 91 and the gap between the concave mirror CM and the heat-sink plate 92 are considerably small with the gas in between, the heat at the reflectors M1, M2 and at the concave mirror CM can be radiated to the heat-sink member 91 and to the heat-sink plate 92, respectively, with little thermal resistance of the gas. Accordingly, the heat can be prevented from accumulating inside the reflectors M1, M2 and inside the concave mirror CM, whereby it becomes feasible to implement highly accurate exposure with less aberration variation.

Further, the present embodiment may also be arranged to provide the heat-sink member 91 and the heat-sink plate 92 each with a cooler as a forced cooling means, as in the second embodiment.

Eleventh Embodiment

Figure 14:
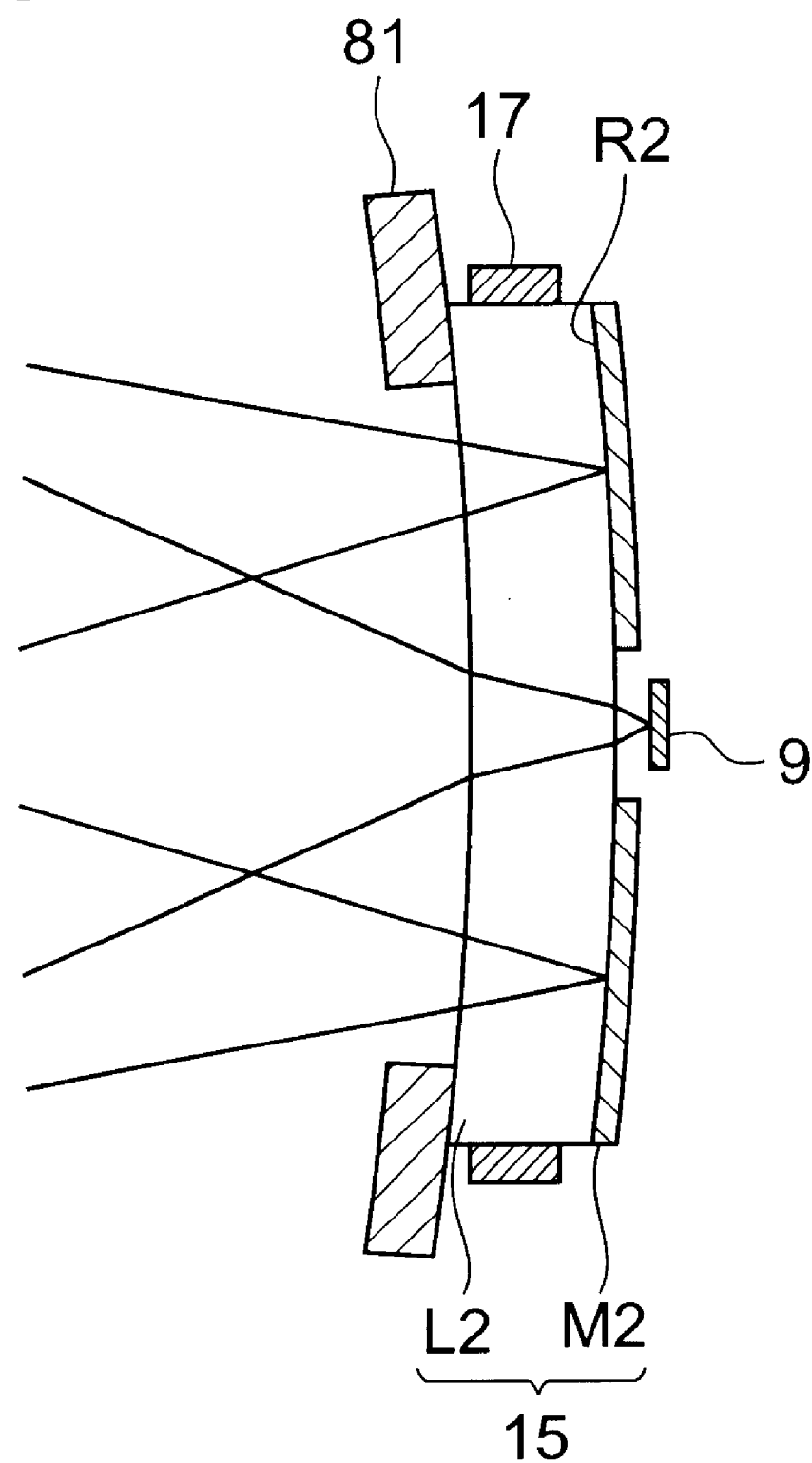
FIG. 14 is a diagram to show the structure of the projection exposure apparatus according to the eleventh embodiment of the present invention.

FIG. 14 is a diagram to show the projection exposure apparatus according to the eleventh embodiment of the present invention. The figure is an enlarged view of the part around the back reflector 15. The present embodiment is different in the following point from the first embodiment.

Namely, in the present embodiment a heat-sink plate 81 of the ring shape is not disposed on the side of the sub-mirror M2 of the back reflector, but is set n contact with the lens component L2. This heat-sink plate 81 is made of a material having a higher heat conductivity than the lens component L2, as in the first embodiment.

For this reason, the heat generated at the reflective surface R2 of the sub-mirror M2, which generates relatively large quantity of heat, becomes easier to escape to the heat-sink plate 81 rather than to the lens component L2. This can reduce the thermal deformation or the like of the lens component L2, so as to permit imaging with high accuracy.

As apparent from the above description, the first projection exposure apparatus according to the present invention is constructed so that the heat-transfer member containing the material with the larger heat conductivity than the member having the reflective surface is set in contact with the member having the reflective surface, whereby the heat generated at the reflective surface upon incidence of the exposure light can be readily radiated to the outside of the member having the reflective surface. Therefore, the heat can be prevented from accumulating inside the member having the reflective surface, so that it becomes feasible to implement highly accurate exposure with less aberration variation.

The second projection exposure apparatus is constructed so that between the first reflective surface and the second reflective surface the exposure light passes multiple times in the refracting member placed between the first reflective surface and the second reflective surface. Since at least one surface of the refracting member placed between the first reflective surface and the second reflective surface is coated either with no coat or with three or less coat layers, absorption can be controlled to the minimum at the transmissive surface of the refracting member. This can prevent heat from accumulating in the refracting member, thereby permitting highly accurate exposure with less aberration variation.

The third projection exposure apparatus is constructed so that the exposure light emerging from the first surface travels through the second transparent portion onto the first reflective surface to be reflected thereby and thereafter is further reflected by the second reflective surface to be guided through the first transparent portion to the second surface. In this case, the first reflective surface or the second reflective surface satisfies above Condition (1), so that absorption of the exposure light, i.e., heating values are balanced to some extent between the reflective surface and the transmissive surface. This can prevent the transmissive member from being locally heated to cause heterogeneous aberration variation, thereby permitting highly accurate exposure.

Since the fourth projection exposure apparatus is arranged so that the expansion coefficient β of at least one material out of the materials making the reflector satisfies above Condition (2), the expansion coefficients of the reflector and barrel can be made approximately coincident with each other. Namely, even if the focal length varies due to the heat generated at the reflector, the size of the barrel also varies according to it. Therefore, variation can be suppressed in the focus state of the projection optical system, so as to permit highly accurate exposure.

Since the projection exposure method of the present embodiment employs the above projection exposure apparatus, it can suppress the aberration variation of the projection optical system and the variation of the focus state thereof, thus enabling highly accurate exposure.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A projection exposure apparatus comprising a catadioptric system for focusing an image of a first surface on a second surface,
    wherein said catadioptric system comprises a member having a reflective surface,
    said apparatus comprising a heat-transfer member which contains a material with a larger heat conductivity than that of said member having the reflective surface and which is disposed in contact with said member having the reflective surface.

2. The projection exposure apparatus according to claim 1, wherein said member having the reflective surface comprises an optical member transmitting light, and a reflecting plate having said reflective surface,
    wherein a surface of said reflecting plate on the side where said reflective surface is formed, has an effective reflection area and is in contact with said optical member, and
    wherein said heat-transfer member is in contact with a back face of a region where said effective reflection area of said reflecting plate exists.

3. The projection exposure apparatus according to claim 1, further comprising forced cooling means connected to said heat-transfer member.

4. The projection exposure apparatus according to claim 1, wherein said member having the reflective surface is a member including a refractive surface.

5. The projection exposure apparatus according to claim 1, wherein said catadioptric system comprises a first reflective surface and a second reflective surface opposed to each other, as said reflective surface, wherein said first reflective surface and second reflective surface have a first transparent portion and a second transparent portion, respectively, capable of transmitting at least a portion of light in the central part, and wherein at least one of said first reflective surface and second reflective surface is included in said member having the reflective surface.

6. An exposure method using the projection exposure apparatus as set forth in claim 1, comprising:
    a step of generating illumination light;
    a step of placing a mask with a predetermined pattern formed therein, on said first surface and illuminating the mask with said illumination light; and
    a step of projecting an image of said predetermined pattern of said mask placed on said first surface, onto a photosensitive substrate placed on said second surface, using said catadioptric system.

7. A projection exposure apparatus comprising a catadioptric system for focusing an image of a first surface on a second surface,
    wherein said catadioptric system comprises a first reflective surface and a second reflective surface opposed to each other, and a refracting member disposed between said first reflective surface and second reflective surface and defining a gap between one of said first and second reflective surfaces,
    wherein at least one surface of said refracting member through which light passes after traversing the gap is not coated with an antireflection material.

8. An exposure method using the projection exposure apparatus as set forth in claim 7, comprising:
    a step of generating illumination light;
    a step of placing a mask with a predetermined pattern formed therein, on said first surface and illuminating the mask with said illumination light; and
    a step of projecting an image of said predetermined pattern of said mask placed on said first surface, onto a photosensitive substrate placed on said second surface, using said catadioptric system.

9. The projection exposure apparatus according to claim 7, further comprising an antireflection layer on the at least one surface, the antireflection layer having no more than three coatings of the antireflection material.

10. The projection exposure apparatus according to claim 7, wherein the at least one surface is the at least one surface that is exposed to air.

11. The projection exposure apparatus according to claim 7, further comprising an antireflection layer on the at least one surface, the antireflection layer being a monolayer coat of the antireflection material.

12. The projection exposure apparatus according to claim 11, wherein the antireflection material comprises $MgF_2$.

13. A projection exposure apparatus comprising a catadioptric system for focusing an image of a first surface on a second surface,
    wherein said catadioptric system comprises a first reflective surface and a second reflective surface opposed to each other, and a refracting member disposed between said first reflective surface and second reflective surface,
    wherein at least one surface of said refracting member is coated either with no coat or with three or less coat layers, and
    wherein at least one of said first reflective surface and second reflective surface has a positive power, wherein said first reflective surface and second reflective surface have a first transparent portion and a second transparent portion, respectively, capable of transmitting at least a portion of light in the central part, and wherein a shield plate for absorbing light incident to said catadioptric system is disposed in a portion of a space between said first transparent portion and second transparent portion.

14. A projection exposure apparatus comprising a catadioptric system for focusing an image of a first surface on a second surface, wherein the catadioptric system comprises a first reflective surface and a second reflective surface, at least one of the first and second reflective surfaces has a positive power, and said first reflective surface and second reflective surface have a first transparent portion and a second transparent portion, respectively, capable of transmitting at least a portion of light in the central part, wherein at least one of said first reflective surface and second reflective surface is formed in an end face of a transmissive member, wherein the following condition is satisfied:

$$S2/\phi2^2 < 3S1/(\phi1^2 - \phi2^2),$$

where $\phi1$ and $S1$ are an effective diameter and an absorptance, respectively, on the occasion of incidence to the reflective surface formed in the end face of said transmissive member and where $\phi2$ and $S2$ are an effective diameter and an absorptance, respectively, on the occasion of incidence to a transmissive surface abutting on the reflective surface formed in the end face of said transmissive member.

15. An exposure method using the projection exposure apparatus as set forth in claim 14, comprising:

a step of generating illumination light;

a step of placing a mask with a predetermined pattern formed therein, on said first surface and illuminating the mask with said illumination light; and a step of projecting an image of said predetermined pattern of said mask placed on said first surface, onto a photosensitive substrate placed on said second surface, using said catadioptric system.

16. A projection exposure apparatus comprising a projection optical system for focusing an image of a first surface on a second surface, wherein said projection optical system comprises at least one reflector, wherein a coefficient $\beta$ of expansion of at least one material out of those making said reflector satisfies the following condition:

$$\alpha/3 < \beta < 3\alpha, \alpha \neq \beta,$$

where $\alpha$ is a coefficient of thermal expansion, $(dL/L)/dT$, of a barrel of said projection optical system.

17. An exposure method using the projection exposure apparatus as set forth in claim 16, comprising:

a step of generating illumination light;

a step of placing a mask with a predetermined pattern formed therein, on said first surface and illuminating the mask with said illumination light; and a step of projecting an image of said predetermined pattern of said mask placed on said first surface, onto a photosensitive substrate placed on said second surface, using said projection optical system.

18. A projection exposure apparatus comprising a projection optical system disposed in an optical path between a first surface and a second surface and which forms an image of the first surface onto the second surface, wherein the projection optical system comprises a reflecting optical member having a reflective surface, the apparatus comprising a heat-transfer member disposed at a position on the opposite side to a direction of reflection of light on the reflective surface and with a predetermined space from said optical member, wherein at least a portion of the space between the heat-transfer member and the reflective surface is filled with a predetermined gas.

19. The projection exposure apparatus according to claim 18, wherein said space between said optical member and said heat-transfer member is not more than 30 mm.

20. An exposure method using a projection exposure apparatus, comprising:

a step of generating illumination radiation;

a step of placing a mask with a predetermined pattern formed therein; on a first surface and illuminating the mask with the illumination radiation; and a step of projecting an image of the predetermined pattern of the mask placed on the first surface, onto a photosensitive substrate placed on a second surface, wherein the projection exposure apparatus comprises a projection optical system for focusing an image of the first surface on the second surface, wherein said projection optical system comprises a reflecting optical member having a reflective surface, the apparatus comprising a heat-transfer member disposed at a position on the opposite side to a direction of reflection of radiation on the reflective surface and with a predetermined space from the optical member, wherein at least a portion of the space between the heat-transfer member and the reflective surface is filled with a predetermined gas.

* * * * *